(12) United States Patent
Maayan

(10) Patent No.: US 7,535,765 B2
(45) Date of Patent: May 19, 2009

(54) NON-VOLATILE MEMORY DEVICE AND METHOD FOR READING CELLS

(75) Inventor: Eduardo Maayan, Kfar Saba (IL)

(73) Assignee: Saifun Semiconductors Ltd., Netanya (IL)

( * ) Notice: Subject to any disclaimer, the term of this patent is extended or adjusted under 35 U.S.C. 154(b) by 118 days.

(21) Appl. No.: 11/822,777

(22) Filed: Jul. 10, 2007

(65) Prior Publication Data

US 2008/0002464 A1    Jan. 3, 2008

Related U.S. Application Data

(63) Continuation-in-part of application No. 11/205,411, filed on Aug. 17, 2005, now Pat. No. 7,242,618, which is a continuation-in-part of application No. 11/007,332, filed on Dec. 9, 2004, now Pat. No. 7,257,025.

(51) Int. Cl.
*G11C 16/04* (2006.01)
(52) U.S. Cl. .................. 365/185.2; 365/185.22
(58) Field of Classification Search .............. 365/185.2, 365/185.22, 185.24
See application file for complete search history.

(56) References Cited

U.S. PATENT DOCUMENTS

| | | | |
|---|---|---|---|
| 3,881,180 A | 4/1975 | Gosney, Jr. | |
| 3,895,360 A | 7/1975 | Cricchi et al. | |
| 3,952,325 A | 4/1976 | Beale et al. | |
| 4,016,588 A | 4/1977 | Ohya et al. | |
| 4,017,888 A | 4/1977 | Christie et al. | |
| 4,173,766 A | 11/1979 | Hayes | |
| 4,247,861 A | 1/1981 | Hsu et al. | |
| 4,257,832 A | 3/1981 | Schwabe et al. | |
| 4,281,397 A | 7/1981 | Neal et al. | |
| 4,306,353 A | 12/1981 | Jacobs et al. | |
| 4,342,102 A | 7/1982 | Puar | |
| 4,342,149 A | 8/1982 | Jacobs et al. | |
| 4,360,900 A | 11/1982 | Bates | |
| 4,373,248 A | 2/1983 | McElroy | |
| 4,388,705 A | 6/1983 | Sheppard | |
| 4,389,705 A | 6/1983 | Sheppard | |

(Continued)

FOREIGN PATENT DOCUMENTS

EP    1073120    3/2001

(Continued)

OTHER PUBLICATIONS

Mitchell, et al, "A New Self-Aligned Planar Array Cell for Ultra High Intensity EPROMS", International Electron Devices Meeting Technical Digest, 1987, pp. 548-551.

(Continued)

*Primary Examiner*—Vu A Le
(74) *Attorney, Agent, or Firm*—EMPK & Shiloh, LLP

(57) ABSTRACT

A non-volatile device and method of operating the device including changing a read reference level for reading a group of memory cells as a function of changes in a threshold voltage distribution of a different group of memory cells. The changing step may include determining a history read reference level of a history cell associated with a group of memory cells of a non-volatile memory cell array and comparing sensed logical state distributions with stored logical state distributions.

16 Claims, 11 Drawing Sheets

U.S. PATENT DOCUMENTS

| | | |
|---|---|---|
| 4,435,786 A | 3/1984 | Tickle |
| 4,471,373 A | 9/1984 | Shimizu et al. |
| 4,507,673 A | 3/1985 | Aoyama et al. |
| 4,521,796 A | 6/1985 | Rajkanan et al. |
| 4,527,257 A | 7/1985 | Cricchi |
| 4,586,163 A | 4/1986 | Koiki |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,857,770 A | 8/1989 | Partovi et al. |
| 4,870,470 A | 9/1989 | Bass, Jr. et al. |
| 4,888,735 A | 12/1989 | Lee et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,042,009 A | 8/1991 | Kazerounian et al. |
| 5,075,245 A | 12/1991 | Woo et al. |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,289,412 A | 2/1994 | Frary et al. |
| 5,293,563 A | 3/1994 | Ohta |
| 5,295,092 A | 3/1994 | Hotta |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,369,615 A | 11/1994 | Harari et al. |
| 5,375,094 A | 12/1994 | Naruke |
| 5,381,374 A | 1/1995 | Shiraishi et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,428,621 A | 6/1995 | Mehrotra et al. |
| 5,434,825 A | 7/1995 | Harari |
| 5,436,478 A | 7/1995 | Bergemont |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sukurai et al. |
| 5,508,968 A | 4/1996 | Collins et al. |
| 5,518,942 A | 5/1996 | Shrivastava |
| 5,521,870 A | 5/1996 | Ishikawa |
| 5,523,972 A | 6/1996 | Rashid et al. |
| 5,530,803 A | 6/1996 | Chang et al. |
| 5,534,804 A | 7/1996 | Woo |
| 5,553,018 A | 9/1996 | Wang et al. |
| 5,557,221 A | 9/1996 | Taguchi et al. |
| 5,557,570 A | 9/1996 | Iwahashi |
| 5,563,823 A | 10/1996 | Yui et al. |
| 5,566,125 A | 10/1996 | Fazio et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee |
| 5,606,523 A | 2/1997 | Mirabel |
| 5,608,679 A | 3/1997 | Mi et al. |
| 5,612,642 A | 3/1997 | McClintock |
| 5,617,357 A | 4/1997 | Haddad et al. |
| 5,619,452 A | 4/1997 | Miyauchi |
| 5,623,438 A | 4/1997 | Guritz et al. |
| 5,627,790 A | 5/1997 | Golla et al. |
| 5,633,603 A | 5/1997 | Le |
| 5,636,288 A | 6/1997 | Bonneville et al. |
| 5,642,312 A * | 6/1997 | Harari .................. 365/185.03 |
| 5,644,531 A | 7/1997 | Kuo et al. |
| 5,650,959 A | 7/1997 | Hayashi et al. |
| 5,654,568 A | 8/1997 | Nakao |
| 5,656,513 A | 8/1997 | Wang et al. |
| 5,657,332 A | 8/1997 | Auclair et al. |
| 5,661,060 A | 8/1997 | Gill et al. |
| 5,663,907 A | 9/1997 | Frayer et al. |
| 5,672,959 A | 9/1997 | Der |
| 5,675,280 A | 10/1997 | Nomura et al. |
| 5,677,867 A | 10/1997 | Hazani |
| 5,677,869 A | 10/1997 | Fazio et al. |
| 5,683,925 A | 11/1997 | Irani et al. |
| 5,689,459 A | 11/1997 | Chang et al. |
| 5,694,356 A | 12/1997 | Wong et al. |
| 5,696,929 A | 12/1997 | Hasbun et al. |
| 5,708,608 A | 1/1998 | Park et al. |
| 5,712,814 A | 1/1998 | Fratin et al. |
| 5,712,815 A | 1/1998 | Bill et al. |
| 5,715,193 A | 2/1998 | Norman |
| 5,717,632 A | 2/1998 | Richart et al. |
| 5,717,635 A | 2/1998 | Akatsu |
| 5,726,946 A | 3/1998 | Yamagata et al. |
| 5,748,534 A | 5/1998 | Dunlap et al. |

| | | | | | | |
|---|---|---|---|---|---|---|
| 5,751,037 A | 5/1998 | Aozasa et al. | | 6,037,627 A | 3/2000 | Kitamura et al. |
| 5,751,637 A | 5/1998 | Chen et al. | | 6,040,610 A | 3/2000 | Noguchi et al. |
| 5,754,475 A | 5/1998 | Bill et al. | | 6,040,996 A | 3/2000 | Kong |
| 5,760,634 A | 6/1998 | Fu | | 6,044,019 A | 3/2000 | Cernea et al. |
| 5,768,192 A | 6/1998 | Eitan | | 6,044,022 A | 3/2000 | Nachumovsky |
| 5,768,193 A | 6/1998 | Lee et al. | | 6,064,226 A | 5/2000 | Earl |
| 5,774,395 A | 6/1998 | Richart et al. | | 6,064,591 A | 5/2000 | Takeuchi et al. |
| 5,777,919 A | 7/1998 | Chi-Yung et al. | | 6,074,916 A | 6/2000 | Cappelletti |
| 5,781,476 A | 7/1998 | Seki et al. | | 6,081,456 A | 6/2000 | Dadashev |
| 5,781,478 A | 7/1998 | Takeuchi et al. | | 6,084,794 A | 7/2000 | Lu et al. |
| 5,783,934 A | 7/1998 | Tran | | 6,091,640 A | 7/2000 | Kawahara et al. |
| 5,784,314 A | 7/1998 | Sali et al. | | 6,097,639 A | 8/2000 | Choi et al. |
| 5,787,036 A | 7/1998 | Okazawa | | 6,108,240 A | 8/2000 | Lavi et al. |
| 5,793,079 A | 8/1998 | Georgescu et al. | | 6,108,241 A | 8/2000 | Chavallier |
| 5,801,076 A | 9/1998 | Ghneim et al. | | 6,117,714 A | 9/2000 | Beatty |
| 5,805,500 A | 9/1998 | Campardo et al. | | 6,118,692 A | 9/2000 | Banks |
| 5,812,449 A | 9/1998 | Song | | 6,122,198 A | 9/2000 | Haddad et al. |
| 5,812,456 A | 9/1998 | Hull et al. | | 6,128,226 A | 10/2000 | Eitan et al. |
| 5,812,457 A | 9/1998 | Arase | | 6,130,452 A | 10/2000 | Lu et al. |
| 5,822,256 A | 10/1998 | Bauer et al. | | 6,134,156 A | 10/2000 | Eitan |
| 5,825,683 A | 10/1998 | Chang | | 6,137,718 A | 10/2000 | Reisinger |
| 5,825,686 A | 10/1998 | Schmitt-Landsiedel et al. | | 6,147,904 A | 11/2000 | Liron |
| 5,828,601 A | 10/1998 | Hollmer et al. | | 6,147,906 A | 11/2000 | Bill et al. |
| 5,834,851 A | 11/1998 | Ikeda et al. | | 6,148,435 A | 11/2000 | Bettman |
| 5,835,935 A | 11/1998 | Estakhri et al. | | 6,150,800 A | 11/2000 | Kinoshita et al. |
| 5,836,772 A | 11/1998 | Chang et al. | | 6,154,081 A | 11/2000 | Pakkala et al. |
| 5,841,700 A | 11/1998 | Chang | | 6,157,570 A | 12/2000 | Nachumovsky |
| 5,847,441 A | 12/1998 | Cutter et al. | | 6,163,048 A | 12/2000 | Hirose et al. |
| 5,861,771 A | 1/1999 | Matsuda et al. | | 6,163,484 A | 12/2000 | Uekubo |
| 5,862,076 A | 1/1999 | Eitan | | 6,169,691 B1 | 1/2001 | Pasotti et al. |
| 5,864,164 A | 1/1999 | Wen | | 6,175,519 B1 | 1/2001 | Lu et al. |
| 5,867,429 A | 2/1999 | Chen et al. | | 6,175,523 B1 | 1/2001 | Yang et al. |
| 5,870,334 A | 2/1999 | Hemink et al. | | 6,181,597 B1 | 1/2001 | Nachumovsky |
| 5,870,335 A | 2/1999 | Khan et al. | | 6,181,605 B1 | 1/2001 | Hollmer et al. |
| 5,875,128 A | 2/1999 | Ishizuka | | 6,188,211 B1 | 2/2001 | Rincon-Mora et al. |
| 5,877,537 A | 3/1999 | Aoki | | 6,190,966 B1 | 2/2001 | Ngo et al. |
| 5,880,620 A | 3/1999 | Gitlin et al. | | 6,192,445 B1 | 2/2001 | Rezvani |
| 5,886,927 A | 3/1999 | Takeuchi | | 6,201,282 B1 | 3/2001 | Eitan |
| 5,892,710 A | 4/1999 | Fazio et al. | | 6,201,737 B1 | 3/2001 | Hollmer et al. |
| 5,903,031 A | 5/1999 | Yamada et al. | | 6,205,055 B1 | 3/2001 | Parker |
| 5,910,924 A | 6/1999 | Tanaka et al. | | 6,205,056 B1 | 3/2001 | Pan et al. |
| 5,920,503 A | 7/1999 | Lee et al. | | 6,205,059 B1 | 3/2001 | Gutala et al. |
| 5,920,507 A | 7/1999 | Takeuchi et al. | | 6,208,200 B1 | 3/2001 | Arakawa |
| 5,926,409 A | 7/1999 | Engh et al. | | 6,208,557 B1 | 3/2001 | Bergemont et al. |
| 5,930,195 A | 7/1999 | Komatsu | | 6,214,666 B1 | 4/2001 | Mehta |
| 5,933,366 A | 8/1999 | Yoshikawa | | 6,215,148 B1 | 4/2001 | Eitan |
| 5,933,367 A | 8/1999 | Matsuo et al. | | 6,215,697 B1 | 4/2001 | Lu et al. |
| 5,936,888 A | 8/1999 | Sugawara | | 6,215,702 B1 | 4/2001 | Derhacobian et al. |
| 5,940,332 A | 8/1999 | Artieri | | 6,218,695 B1 | 4/2001 | Nachumovsky |
| 5,946,558 A | 8/1999 | Hsu | | 6,219,277 B1 | 4/2001 | Devin et al. |
| 5,949,714 A | 9/1999 | Hemink et al. | | 6,222,762 B1 | 4/2001 | Guteman et al. |
| 5,959,311 A | 9/1999 | Shih et al. | | 6,222,768 B1 | 4/2001 | Hollmer et al. |
| 5,963,412 A | 10/1999 | En | | 6,233,180 B1 | 5/2001 | Eitan et al. |
| 5,963,465 A | 10/1999 | Eitan | | 6,240,032 B1 | 5/2001 | Fukumoto |
| 5,966,603 A | 10/1999 | Eitan | | 6,240,040 B1 | 5/2001 | Akaogi et al. |
| 5,969,989 A | 10/1999 | Iwahashi | | 6,246,555 B1 | 6/2001 | Tham |
| 5,969,993 A | 10/1999 | Takeshima | | 6,252,442 B1 | 6/2001 | Malherbe |
| 5,973,373 A | 10/1999 | Krautschneider et al. | | 6,252,799 B1 | 6/2001 | Liu et al. |
| 5,986,940 A | 11/1999 | Atsumi et al. | | 6,256,231 B1 | 7/2001 | Lavi et al. |
| 5,990,526 A | 11/1999 | Bez et al. | | 6,259,612 B1 | 7/2001 | Itoh |
| 5,991,201 A | 11/1999 | Kuo et al. | | 6,261,904 B1 | 7/2001 | Pham et al. |
| 5,991,202 A | 11/1999 | Derhacobian et al. | | 6,265,268 B1 | 7/2001 | Halliyal et al. |
| 5,991,517 A | 11/1999 | Harari et al. | | 6,266,281 B1 | 7/2001 | Derhacobian et al. |
| 5,999,444 A | 12/1999 | Fujiwara et al. | | 6,272,047 B1 | 8/2001 | Mihnea et al. |
| 6,000,006 A | 12/1999 | Bruce et al. | | 6,275,414 B1 | 8/2001 | Randolph et al. |
| 6,005,423 A | 12/1999 | Schultz | | 6,281,545 B1 | 8/2001 | Liang et al. |
| 6,011,715 A | 1/2000 | Pasotti et al. | | 6,282,133 B1 | 8/2001 | Nakagawa et al. |
| 6,011,725 A | 1/2000 | Eitan | | 6,282,145 B1 | 8/2001 | Tran et al. |
| 6,018,186 A | 1/2000 | Hsu | | 6,285,246 B1 | 9/2001 | Basu |
| 6,020,241 A | 2/2000 | You et al. | | 6,285,574 B1 | 9/2001 | Eitan |
| 6,030,871 A | 2/2000 | Eitan | | 6,285,589 B1 | 9/2001 | Kajitani |
| 6,034,403 A | 3/2000 | Wu | | 6,285,614 B1 | 9/2001 | Mulatti et al. |
| 6,034,896 A | 3/2000 | Ranaweera et al. | | 6,292,394 B1 | 9/2001 | Cohen et al. |

| Patent | Date | Inventor |
|---|---|---|
| 6,297,096 B1 | 10/2001 | Eitan |
| 6,297,974 B1 | 10/2001 | Ganesan et al. |
| 6,304,485 B1 | 10/2001 | Harari et al. |
| 6,307,784 B1 | 10/2001 | Hamilton et al. |
| 6,307,807 B1 | 10/2001 | Sakui et al. |
| 6,320,786 B1 | 11/2001 | Chang et al. |
| 6,326,265 B1 | 12/2001 | Liu et al. |
| 6,330,192 B1 | 12/2001 | Ohba et al. |
| 6,331,950 B1 | 12/2001 | Kuo et al. |
| 6,335,874 B1 | 1/2002 | Eitan |
| 6,337,502 B1 | 1/2002 | Eitan et al. |
| 6,339,556 B1 | 1/2002 | Watanabe |
| 6,343,033 B1 | 1/2002 | Parker |
| 6,348,381 B1 | 2/2002 | Jong et al. |
| 6,348,711 B1 | 2/2002 | Eitan |
| 6,351,415 B1 | 2/2002 | Kushnarenko |
| 6,353,554 B1 | 3/2002 | Banks |
| 6,353,555 B1 | 3/2002 | Jeong |
| 6,374,337 B1 | 4/2002 | Estakhri |
| 6,385,086 B1 | 5/2002 | Mihara et al. |
| 6,396,741 B1 | 5/2002 | Bloom et al. |
| 6,400,209 B1 | 6/2002 | Matsuyama et al. |
| 6,400,607 B1 | 6/2002 | Pasotti et al. |
| 6,407,537 B2 | 6/2002 | Antheunis |
| 6,418,506 B1 | 7/2002 | Pashley et al. |
| 6,426,898 B1 | 7/2002 | Mihnea et al. |
| 6,429,063 B1 | 8/2002 | Eitan |
| 6,433,264 B1 | 8/2002 | Grossnickle et al. |
| 6,436,766 B1 | 8/2002 | Rangarajan et al. |
| 6,436,768 B1 | 8/2002 | Yang et al. |
| 6,438,031 B1 | 8/2002 | Fastow |
| 6,438,035 B2 | 8/2002 | Yamamoto et al. |
| 6,440,797 B1 | 8/2002 | Wu et al. |
| 6,442,074 B1 | 8/2002 | Hamilton et al. |
| 6,445,030 B1 | 9/2002 | Wu et al. |
| 6,448,750 B1 | 9/2002 | Shor et al. |
| 6,449,188 B1 | 9/2002 | Fastow |
| 6,449,190 B1 | 9/2002 | Bill |
| 6,455,896 B1 | 9/2002 | Chou et al. |
| 6,456,528 B1 | 9/2002 | Chen |
| 6,456,533 B1 | 9/2002 | Hamilton et al. |
| 6,456,539 B1 | 9/2002 | Nguyen et al. |
| 6,458,656 B1 | 10/2002 | Park et al. |
| 6,469,929 B1 | 10/2002 | Kushnarenko et al. |
| 6,469,935 B2 | 10/2002 | Hayashi |
| 6,472,706 B2 | 10/2002 | Widdershoven et al. |
| 6,477,084 B1 | 11/2002 | Eitan |
| 6,477,085 B1 | 11/2002 | Kuo |
| 6,490,204 B2 | 12/2002 | Bloom et al. |
| 6,496,414 B2 | 12/2002 | Kasa et al. |
| 6,504,756 B2 | 1/2003 | Gonzalez et al. |
| 6,510,082 B1 | 1/2003 | Le et al. |
| 6,512,701 B1 | 1/2003 | Hamilton et al. |
| 6,519,180 B2 | 2/2003 | Tran et al. |
| 6,519,182 B1 | 2/2003 | Derhacobian et al. |
| 6,522,585 B2 | 2/2003 | Pasternak |
| 6,525,969 B1 | 2/2003 | Kurihara et al. |
| 6,528,390 B2 | 3/2003 | Komori et al. |
| 6,529,412 B1 | 3/2003 | Chen et al. |
| 6,532,173 B2 | 3/2003 | Iioka et al. |
| 6,535,020 B1 | 3/2003 | Yin |
| 6,535,434 B2 | 3/2003 | Maayan et al. |
| 6,537,881 B1 | 3/2003 | Rangarajan et al. |
| 6,538,270 B1 | 3/2003 | Randolph et al. |
| 6,541,816 B2 | 4/2003 | Ramsbey et al. |
| 6,552,387 B1 | 4/2003 | Eitan |
| 6,555,436 B2 | 4/2003 | Ramsbey et al. |
| 6,559,500 B2 | 5/2003 | Torii |
| 6,562,683 B1 | 5/2003 | Wang et al. |
| 6,566,699 B2 | 5/2003 | Eitan |
| 6,567,303 B1 | 5/2003 | Hamilton et al. |
| 6,567,312 B1 | 5/2003 | Torii et al. |
| 6,567,316 B1 | 5/2003 | Ohba et al. |
| 6,570,211 B1 | 5/2003 | He et al. |
| 6,574,139 B2 | 6/2003 | Kurihara |
| 6,577,532 B1 | 6/2003 | Chevallier |
| 6,577,547 B2 | 6/2003 | Ukon |
| 6,583,005 B2 | 6/2003 | Hashimoto et al. |
| 6,583,007 B1 | 6/2003 | Eitan |
| 6,583,479 B1 | 6/2003 | Fastow et al. |
| 6,584,017 B2 | 6/2003 | Maayan et al. |
| 6,590,811 B1 | 7/2003 | Hamilton et al. |
| 6,593,606 B1 | 7/2003 | Randolph et al. |
| 6,594,181 B1 | 7/2003 | Yamada |
| 6,608,526 B1 | 8/2003 | Sauer |
| 6,608,905 B1 | 8/2003 | Muza et al. |
| 6,614,295 B2 | 9/2003 | Tsuchi |
| 6,614,686 B1 | 9/2003 | Kawamura |
| 6,614,690 B2 | 9/2003 | Roohparvar |
| 6,614,692 B2 | 9/2003 | Eliyahu et al. |
| 6,617,215 B1 | 9/2003 | Halliyal et al. |
| 6,618,290 B1 | 9/2003 | Wang et al. |
| 6,624,672 B2 | 9/2003 | Confaloneri et al. |
| 6,630,384 B1 | 10/2003 | Sun et al. |
| 6,633,496 B2 | 10/2003 | Maayan et al. |
| 6,633,499 B1 | 10/2003 | Eitan et al. |
| 6,633,956 B1 | 10/2003 | Mitani |
| 6,636,440 B2 | 10/2003 | Maayan et al. |
| 6,639,271 B1 | 10/2003 | Zheng et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |
| 6,642,586 B2 | 11/2003 | Takahashi |
| 6,643,170 B2 | 11/2003 | Huang et al. |
| 6,643,177 B1 | 11/2003 | Le et al. |
| 6,643,178 B2 | 11/2003 | Kurihara |
| 6,643,181 B2 | 11/2003 | Sofer et al. |
| 6,649,972 B2 | 11/2003 | Eitan |
| 6,650,568 B2 | 11/2003 | Iijima |
| 6,664,588 B2 | 12/2003 | Eitan |
| 6,665,769 B2 | 12/2003 | Cohen et al. |
| 6,670,669 B1 | 12/2003 | Kawamura |
| 6,674,138 B1 | 1/2004 | Halliyal et al. |
| 6,680,509 B1 | 1/2004 | Wu et al. |
| 6,690,602 B1 | 2/2004 | Le et al. |
| 6,700,818 B2 | 3/2004 | Shappir et al. |
| 6,717,207 B2 | 4/2004 | Kato |
| 6,731,542 B1 | 5/2004 | Le et al. |
| 6,738,289 B2 | 5/2004 | Gongwer et al. |
| 6,744,692 B2 | 6/2004 | Shiota et al. |
| 6,765,259 B2 | 7/2004 | Kim |
| 6,768,165 B1 | 7/2004 | Eitan |
| 6,781,876 B2 | 8/2004 | Forbes et al. |
| 6,788,579 B2 | 9/2004 | Gregori et al. |
| 6,791,396 B2 | 9/2004 | Shor et al. |
| 6,794,249 B2 | 9/2004 | Palm et al. |
| 6,798,699 B2 | 9/2004 | Mihnea et al. |
| 6,818,956 B2 | 11/2004 | Kuo et al. |
| 6,828,638 B2 | 12/2004 | Keshavarzi et al. |
| 6,829,172 B2 | 12/2004 | Bloom et al. |
| 6,992,932 B2 | 1/2006 | Cohen |
| 7,242,618 B2 | 7/2007 | Shappir et al. |
| 2001/0006477 A1 | 7/2001 | Banks |
| 2002/0004878 A1 | 1/2002 | Norman |
| 2002/0004921 A1 | 1/2002 | Muranaka et al. |
| 2002/0064911 A1 | 5/2002 | Eitan |
| 2002/0101765 A1 | 8/2002 | Mihnea et al. |
| 2002/0132436 A1 | 9/2002 | Eliyahu et al. |
| 2002/0199065 A1 | 12/2002 | Subramoney et al. |
| 2003/0001213 A1 | 1/2003 | Lai |
| 2003/0021155 A1 | 1/2003 | Yachareni et al. |
| 2003/0072192 A1 | 4/2003 | Bloom et al. |
| 2003/0076710 A1 | 4/2003 | Sofer et al. |
| 2003/0117841 A1 | 6/2003 | Yamashita |

| | | | |
|---|---|---|---|
| 2003/0131186 A1 | 7/2003 | Buhr | |
| 2003/0134476 A1 | 7/2003 | Roizin et al. | |
| 2003/0137888 A1* | 7/2003 | Chen et al. | 365/200 |
| 2003/0142544 A1 | 7/2003 | Maayan et al. | |
| 2003/0145176 A1 | 7/2003 | Dvir et al. | |
| 2003/0145188 A1 | 7/2003 | Cohen et al. | |
| 2003/0155659 A1 | 8/2003 | Verma et al. | |
| 2003/0197221 A1 | 10/2003 | Shinozaki et al. | |
| 2003/0202411 A1 | 10/2003 | Yamada | |
| 2003/0206435 A1 | 11/2003 | Takahashi | |
| 2003/0208663 A1 | 11/2003 | Van Buskirk et al. | |
| 2003/0209767 A1 | 11/2003 | Takahashi et al. | |
| 2003/0214844 A1 | 11/2003 | Iijima | |
| 2003/0218207 A1 | 11/2003 | Hashimoto et al. | |
| 2003/0218913 A1 | 11/2003 | Le et al. | |
| 2003/0222303 A1 | 12/2003 | Fukuda et al. | |
| 2003/0227796 A1 | 12/2003 | Miki et al. | |
| 2004/0012993 A1 | 1/2004 | Kurihara | |
| 2004/0013000 A1 | 1/2004 | Torii | |
| 2004/0014290 A1 | 1/2004 | Yang et al. | |
| 2004/0021172 A1 | 2/2004 | Zheng et al. | |
| 2004/0027858 A1 | 2/2004 | Takahashi et al. | |
| 2004/0027871 A1* | 2/2004 | Bloom et al. | 365/200 |
| 2004/0151034 A1 | 8/2004 | Shor et al. | |
| 2006/0126382 A1 | 6/2006 | Maayan et al. | |

FOREIGN PATENT DOCUMENTS

| | | |
|---|---|---|
| EP | 1207552 | 5/2002 |
| EP | 1091418 | 6/2003 |
| EP | 1071096 | 9/2003 |
| EP | 1365452 | 11/2003 |
| EP | 1217744 | 3/2004 |
| EP | 1126468 | 12/2005 |
| JP | 58094199 | 6/1983 |
| JP | 60200566 | 10/1985 |
| JP | 60201594 | 10/1985 |
| JP | 63249375 | 10/1988 |
| JP | 3285358 | 12/1991 |
| JP | 4226071 | 8/1992 |
| JP | 5021758 | 3/1993 |
| JP | 5326893 | 12/1993 |
| JP | 6151833 | 5/1994 |
| JP | 6232416 | 8/1994 |
| JP | 7193151 | 7/1995 |
| JP | 08106791 | 4/1996 |
| JP | 08297988 | 11/1996 |
| JP | 09017981 | 1/1997 |
| JP | 9162314 | 6/1997 |
| JP | 10055691 | 2/1998 |
| JP | 10106276 | 4/1998 |
| JP | 10199263 | 7/1998 |
| JP | 10228784 | 8/1998 |
| JP | 10228786 | 8/1998 |
| JP | 10334676 | 12/1998 |
| JP | 11162182 | 6/1999 |
| JP | 11219593 | 8/1999 |
| JP | 11354758 | 12/1999 |
| JP | 20315392 | 11/2000 |
| JP | 1085646 | 3/2001 |
| JP | 21085646 | 3/2001 |
| JP | 21118392 | 4/2001 |
| JP | 21119382 | 4/2001 |
| JP | 21156189 | 6/2001 |
| JP | 22216488 | 8/2002 |
| JP | 3358663 | 12/2002 |
| WO | WO8100790 | 3/1981 |
| WO | WO9625741 | 8/1996 |
| WO | WO9803977 | 1/1998 |
| WO | WO9931670 | 6/1999 |
| WO | WO9957728 | 11/1999 |
| WO | WO0046808 | 8/2000 |
| WO | WO0165566 | 9/2001 |
| WO | WO0165567 | 9/2001 |
| WO | WO0184552 | 11/2001 |
| WO | WO0243073 | 5/2002 |
| WO | WO03032393 | 4/2003 |
| WO | WO03036651 | 5/2003 |
| WO | WO03041083 | 5/2003 |
| WO | WO03054964 | 7/2003 |
| WO | WO03063167 | 7/2003 |
| WO | WO03063168 | 7/2003 |
| WO | WO03079370 | 9/2003 |
| WO | WO03088258 | 10/2003 |
| WO | WO03088259 | 10/2003 |
| WO | WO03088260 | 10/2003 |
| WO | WO03088261 | 10/2003 |
| WO | WO03088353 | 10/2003 |
| WO | WO03100790 | 12/2003 |

OTHER PUBLICATIONS

Chan, et al, "A True Single-Transistor Oxide-Nitride-Oxide EEPROM Device", IEEE Electron Device Letters, vol. EDL-8, No. 3, Mar. 1987.

Ma, et al, "A Dual-bit Split-Gate EEPROM (DSG) Cell in Contactless Array for Single-Vcc High Density Flash Memories", International Electron Devices Meeting Technical Digest, 1994, pp. 57-60.

Bhattacharyya, et al., "FET Gate Structure for Nonvolatile N-Channel Read-Mostly Memory Device", IBM Technical Disclosure Bulletin, vol. 18, No. 6, Nov. 1975.

Esquivel, et al, "High Density, Contactless, Self Aligned EPROM Cell Array Technology", International Electron Devices Meeting Technical Digest, 1986, pp. 592-595.

Chang, Joseph J, "Nonvolatile Semiconductor Memory Devices", Proceedings of the IEEE, vol. 64, No. 7, Jul. 1976, pp. 1039-1059.

Lee, et al, "Scalable 2-bit silicon oxide-nitride-oxide silicon (SONOS) memory with physically separated local nitrides under a merged gate", Solid State Electronics, vol. 48, 2004, pp. 1171-1775.

"Semiconductor Memory: Non-Volatile Memory (NVM)", National University of Singapore, Department of Electrical and Computer Engineering, www.ece.nus.edu.sg/stfpage/elezhucz/myweb/NVM.pdf.

Umezawa, et al, "A 5-V-Only Operation 0.6 μm Flash EEPROM with Row Decoder Scheme in Triple-Well Structure", IEEE Journal of Solid-State Circuits, vol. 27, Nov. 1992, p. 1540.

Jung, et al, "A 117-mm2 3.3.-V Only 128-Mb Multilevel NAND Flash Memory for Mass Storage Applications", IEEE Journal of Solid-State Circuits, vol. 31, No. 11, Nov. 1996, pp. 1575-1583.

Compardo, et al, "40-mm2 3-V Only 5-MHz 64-Mb 2-b/cell CHE NOR Flash Memory", IEEE Journal of Solid-State Circuits, vol. 35, No. 11, Nov. 2000, pp. 1655-1667.

Lin, et al., "Novel Source-Controlled Self-Verified Programming for Multilevel EEPROM's", IEEE Transactions on Electron Devices, vol. 47, No. 6, Jun. 2000, pp. 1166-1174.

Tanaka, et al, "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.

Yoon, et al., "A Novel Substrate Hot Electron and Hole Injection Structure with a Double-Implanted Buried-Channel MOSFET", IEEE Transactions on Electron Devices, vol. 38, No. 12, Dec. 1991, p. 2722.

Martin, Ken, "Improved Circuits for the Realization of Switched-Capacitor Filters", IEEE Transactions on Circuits and Systems, vol. CAS-27, Apr. 1980, pp. 237-244.

Johns, et al, "Analog Integrated Circuit Design", Chapter 10, John Wiley and Sons, Inc., 1997, p. 398.

Allen, et al, "CMOS Analog Circuit Design", Oxford University Press, 2nd Edition, 2002, p. 259.

Klinke, et al., "A Very High Slew-Rate CMOS Operational Amplifier", IEEE Journal of Solid-State Circuits, vol. 24, No. 3, Jun. 1989, pp. 744-746.

Fotouhi, Bahram, "An Efficient CMOS Line Driver for 1.544-Mb/s T1 and 2.048-Mb/s E1 Applications", IEEE Journal of Solid-State Circuits, vol. 38, No. 2, 2003, pp. 226-236.

Roy, Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Lehigh University, Bethlehem, Pennsylvania, 1989, pp. 1-35.

Bu, et al, "Design Considerations in Scaled SONOS Nonvolatile Memory Devices", Lehigh University Presentation, 2000 http://klabs.org/richcontent/MemoryContent/nvmt_symp/nvmts_2000/presentations/bu_white_sonos_lehigh_univ.pdf.

Eitan, et al, "Hot-Electron Injection into the Oxide in n-Channel MOS Devices", IEEE Transactions on Electron Devices, vol. ED-28, No. 3, Mar. 1981, pp. 328-370.

"2 Bit/Cell EEPROM Cell Using Band-To-Band Tunneling for Data Read-Out", IBM Technical Disclosure Bulletin, vol. 35, No. 4B, 1992.

Bude, et al, "EEPROM/Flash Sub 3.0V Drain-Source Bias Hot Carrier Writing", International Electronic Devices Meeting Technical Digest, 1995, pp. 989-992.

Bude, et al, "Secondary Electron Flash—a High Performance, Low Power Flash Technology for 0.35 um and Below", International Electronic Devices Meeting Technical Digest, 1997, pp. 279-282.

Bude, et al, "Modeling Nonequilibrium Hot Carrier Device Effects", Conference of Insular Specialists of Europe, Jun. 1997, Sweden.

* cited by examiner

US 7,535,765 B2

NON-VOLATILE MEMORY DEVICE AND METHOD FOR READING CELLS

CROSS-REFERENCE TO RELATED APPLICATIONS

This application is a continuation-in-part application claiming benefit from U.S. patent application Ser. No. 11/205,411, filed on Aug. 17, 2005 now U.S. Pat. No. 7,242, 618, which application is a continuation-in-part application claiming benefit from U.S. patent application Ser. No. 11/007,332, filed Dec. 9, 2004 now U.S. Pat. No. 7,257,025, both of which are hereby incorporated by reference.

FIELD OF THE INVENTION

The present application relates to non-volatile memory ("NVM") cells generally. More specifically, the application relates to methods of reading NVM cells and NVM devices utilizing these methods.

BACKGROUND OF THE INVENTION

Single and dual charge storage region NVM memory cells are known in the art. One such memory cell is the NROM (nitride read only memory) cell 10, shown in FIG. 1 to which reference is now made, which stores two bits 12 and 14 in a nitride based layer 16 sandwiched between a conductive layer 18 and a channel 20. NROM cells are described in many patents, for example in U.S. Pat. No. 6,649,972, assigned to the common assignees of the present invention, whose disclosure is incorporated herein.

Bits 12 and 14 are individually accessible, and thus, may be programmed (conventionally noted as a '0'), erased (conventionally noted as a '1') or read separately. Reading a bit (12 or 14) involves determining if a threshold voltage Vt, as seen when reading the particular bit, is above (programmed) or below (erased) a read reference voltage level RD.

FIG. 2A, to which reference is now made, illustrates the distribution of programmed and erased states of a memory chip (which typically has a large multiplicity of NROM cells formed into a memory array) as a function of threshold voltage Vt. An erased bit is one whose threshold voltage has been reduced below an erase threshold voltage EV. Thus, an erase distribution 30 has typically its rightmost point in the vicinity of (and preferably at or below) the erase threshold voltage EV. Similarly, a programmed bit is one whose threshold voltage has been increased above a program threshold voltage PV. Thus, a programmed distribution 32 has typically its leftmost point in the vicinity of (and preferably at or above) the program threshold voltage PV.

The difference between the two threshold voltages PV and EV is a window W0 of operation. Read reference voltage level RD is typically placed within window W0 and can be generated, as an example, from a read reference cell. The read reference cell is usually, but not necessarily, in a non-native state, as described in U.S. Pat. No. 6,490,204, assigned to the common assignee of the present invention, whose disclosure is incorporated herein by reference. In such case, the threshold voltage of read reference cell may be at the RD level in FIG. 2A.

The signal from the bit being read is then compared with a comparison circuit (e.g. a differential sense amplifier) to the signal generated by the read reference level, and the result should determine if the array cell is in a programmed or erased state. Alternatively, instead of using a reference cell, the read reference signal can be an independently generated voltage or a current signal. Other methods to generate a read reference signal are known in the art.

Since the sensing scheme circuitry may not be perfect, and its characteristics may vary at different operating and environmental conditions, margins M0 and M1 are typically required to correctly read a '0' and a '1', respectively. As long as the programmed and erased distributions are beyond these margins, reliable reads may be achieved. However, the issue of maintaining a proper margin and reading memory cells become more complicated when dealing with multi-level-cells ("MLC").

In a MLC, two or more programming levels may co-exist on the same cell, as is drawn in FIG. 2B. In the case where an MLC cell is being read to determine at which one of the multiple logical states the cell resides, at least two read reference cells must be used. During read operation, it must be determined that the MLC cell's threshold is in one of three or more regions bounded by the two or more threshold voltages defined by read reference cells. As is depicted in FIG. 2B, the voltage threshold boundaries which define a given state in an MLC are usually considerably smaller than those for a binary NVM cell. FIG. 2B, to which reference is now made, illustrates four different threshold voltage regions of an MLC, where each region is associated with either one of the programmed states of the MLC or with the erased state of the MLC. Because in an MLC a rather fixed range of potential threshold voltages (e.g. 3 Volts to 9 Volts) needs to be split into several sub-ranges or regions, the size of each sub-range or region in an MLC is usually smaller than a region of a binary NVM cell, which binary cell only requires two voltage threshold regions, as seen in FIG. 2A.

The voltage threshold of a NVM cell seldom stays fixed. Threshold voltage drift is a phenomenon which may result in large variations of the threshold voltage of a memory cell. These variations may occur due to charge leakage from the cell's charge storage region, temperature changes, and due to interference from the operation of neighboring NVM cells. FIG. 2C, to which reference is now made, shows a graph depicting threshold voltages ($V_t$) changes associated with two program states of an exemplary MLC due to drift, as a function of time, for 10 cycles and for 1000 cycles. As seen in the graph, voltage drift may occur across numerous cells, and may occur in a correlated pattern across these cells. It is also known that the magnitude and directions of the drifts depends upon the number of times the NVM went through program and erase cycles and on the level of programming of a MLC. It is also known that deviations in cells' ($V_t$) may be either in the upward or downward directions.

Variation of the threshold voltage of memory cells may lead to false reads of the state and may further result in the corruption of the data in the memory array. Voltage drift is especially problematic in MLC cells where the $V_t$ regions or sub-ranges associated with each programmed state are relatively smaller than those for a typical binary cell.

In order to reduce data loss and data corruption due to drift in the threshold voltages of the cells of a NVM array, threshold voltage drift of cells in the NVM array should be compensated for. For a given NVM array, it would be desired to provide one or a set of reference cells whose references threshold voltages are offset from defined verify threshold levels by some value related to the actual voltage drift experienced by the NVM cells to be read. U.S. Pat. No. 6,992,932, assigned to the common assignee of the present application and incorporated herein by reference teaches some solutions to the above mentioned issues. However, there is a well understood and continuing need for more efficient and reliable methods of determining a set of reference voltage levels which may accommodate variations in the threshold voltages of cells of an NVM array, and of established reference cells with the determined reference voltages.

SUMMARY OF THE INVENTION

The present invention is a method, circuit and system for determining a reference voltage. Some embodiments of the present invention relate to a system, method and circuit for establishing a set of operating reference cells to be used in operating (e.g. reading) cells in a NVM block or array. As part of the present invention, at least a subset of cells of the NVM block or array may be read using one or more reference voltage associated with two or more sets of test reference cells or structures, where each set of test reference cells or structures may generate or otherwise provide reference voltages at least slightly offset from each other set of test reference cells or structures. For each set of test reference cells/structures used to read the at least a subset of the NVM block, a read error rate may be calculated or otherwise determined. One or a set of test reference cells/structures associated with a relatively low read error rate may be selected as the set of operating reference cells to be used in operating (e.g. reading) other cells, outside the subset of cells, in the NVM block or array. In a further embodiment, the selected set of test reference cells may be used to select or establish an operating set of reference cells/structures having reference voltages substantially equal to those of the selected test set.

According to some embodiments of the present invention, prior or during the programming of a set of cells in the NVM array, the number of cells to be programmed to each of one or more logical or program states associated with the set of cells may be counted, and the logical state distribution may be stored, for example in a check sum table. As part of some embodiments of the present invention, the number of cells to be programmed to, up to and/or below each logical or program state may be counted and/or stored in a table with is either on the same array as the set of NVM cells or in memory on the same chip as the NVM array. According to some embodiments of the present invention, the logical state distribution of only the history cells associated with a block or sector of the array, or the entire array, may be counted and stored.

Upon the reading of the set of programmed cells, according to some embodiments of the present invention, the number of cells found to be at a given logical or program state may be compared against either corresponding values stored during programming (e.g. the number of cells programmed to a given state) or against a value derived from the values stored during programming (e.g. the number of cells programmed at or above the given state, minus the number of cells programmed to or above an adjacent higher logical state). If there is a discrepancy between the number of cells read at a given state and an expected number based on the values determined/counted/stored during programming, a Read Verify reference threshold value associated with the given program state may be adjusted upward or downward to compensate for the detected error. According to some embodiments of the present invention, the read verify level of an adjacent logical state may also be moved upward or downward in order to compensate for detected read errors at a given state.

For example, according to some embodiments of the present invention, if the number of cells found (e.g. read) in a given program state is below an expected value, either the Read Verify reference voltage associated with that given state may be reduced, or if there is found that the number of cells read above the given state exceeds an expected number, the Read Verify reference associated with a logical state higher and adjacent to the given state may be raised. Conversely, if the number of cells found (e.g. read) in a given program state is above expectations, either the Read Verify reference voltage associated with that given state may be increased, or if there is found that the number of cells read above the given state is below an expected number, the Read Verify reference associated with a logical state higher and adjacent to the given state may be lowered. Thus, Read Verify reference voltages for a set of cells may be selected such that the number of cells found/read in each of the states associated with the set may be substantially equal to the a number either read from or derived from the values counted during programming of the set of cells, which values may have been stored in a check sum table.

According to some embodiments of the present invention, the check sum table may reside on the same chip as the set of NVM cells, and according to a further embodiment of the present invention, a controller may be adapted to perform the above mentioned error detection and Read Verify reference value adjustments. The check sum table may either be stored in the same NVM array as the set of NVM cells, or on some other memory cells residing on the same chip as the NVM array, for example in a register or buffer used by the controller during programming and/or reading. According to other embodiments of the present invention, specialized error coding and detection circuits may be included with a controller on the same chip and the NVM array to be operated.

Read reference levels selected as part of the above mentioned steps may be performed in conjunction with other methods such as the use of one or more history cells. According to some embodiments of the present invention, an NVM device's control logic may compare sensed verses stored logical state distribution using an initial one or set of reference levels (i.e. test reference level/cells/structures) derived from one or more history cells, as described below.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2B, is a graphical illustration of different threshold voltages, each being associated with the boundary of a different program state of a Multi-Level Cell (MLC);

Figure 1:
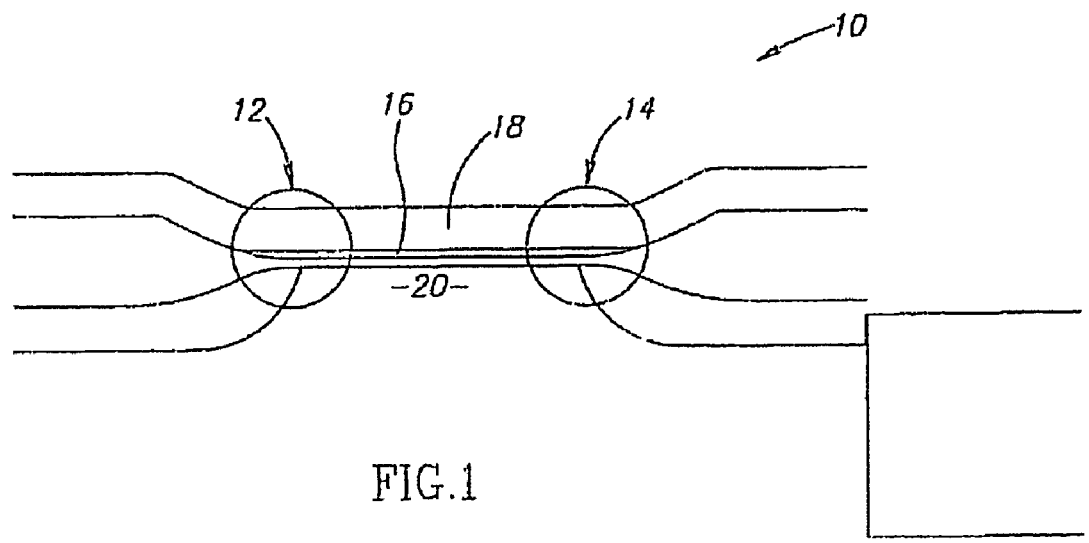
FIG. 1 is a schematic illustration of a prior art NROM cell.
Figure 2A:
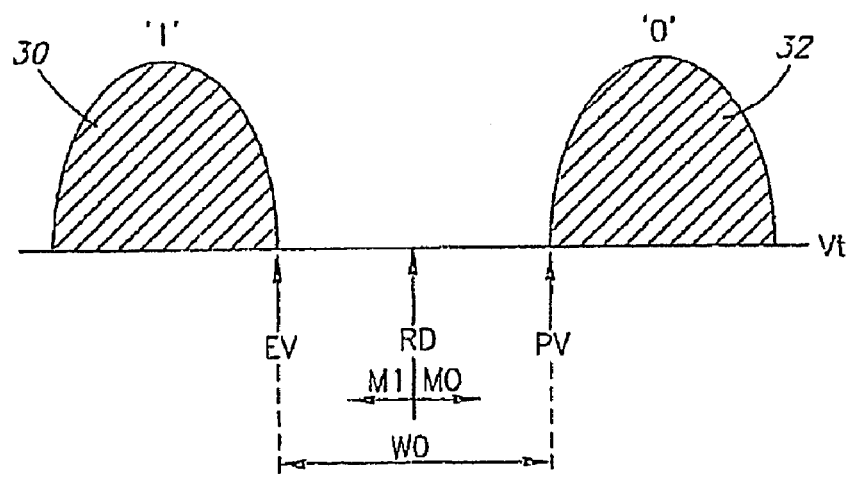
FIG. 2A is a schematic illustration of the distribution of programmed and erased states of a memory chip of NROM cells as a function of threshold voltage Vt.
Figure 1B:
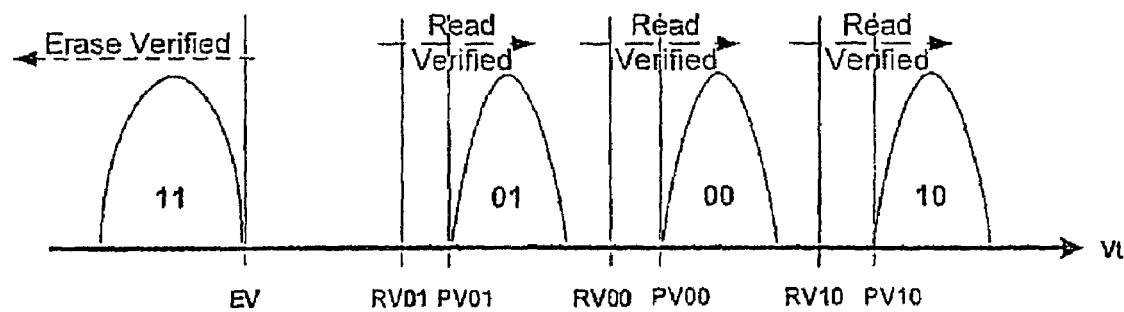
Figure 2C:
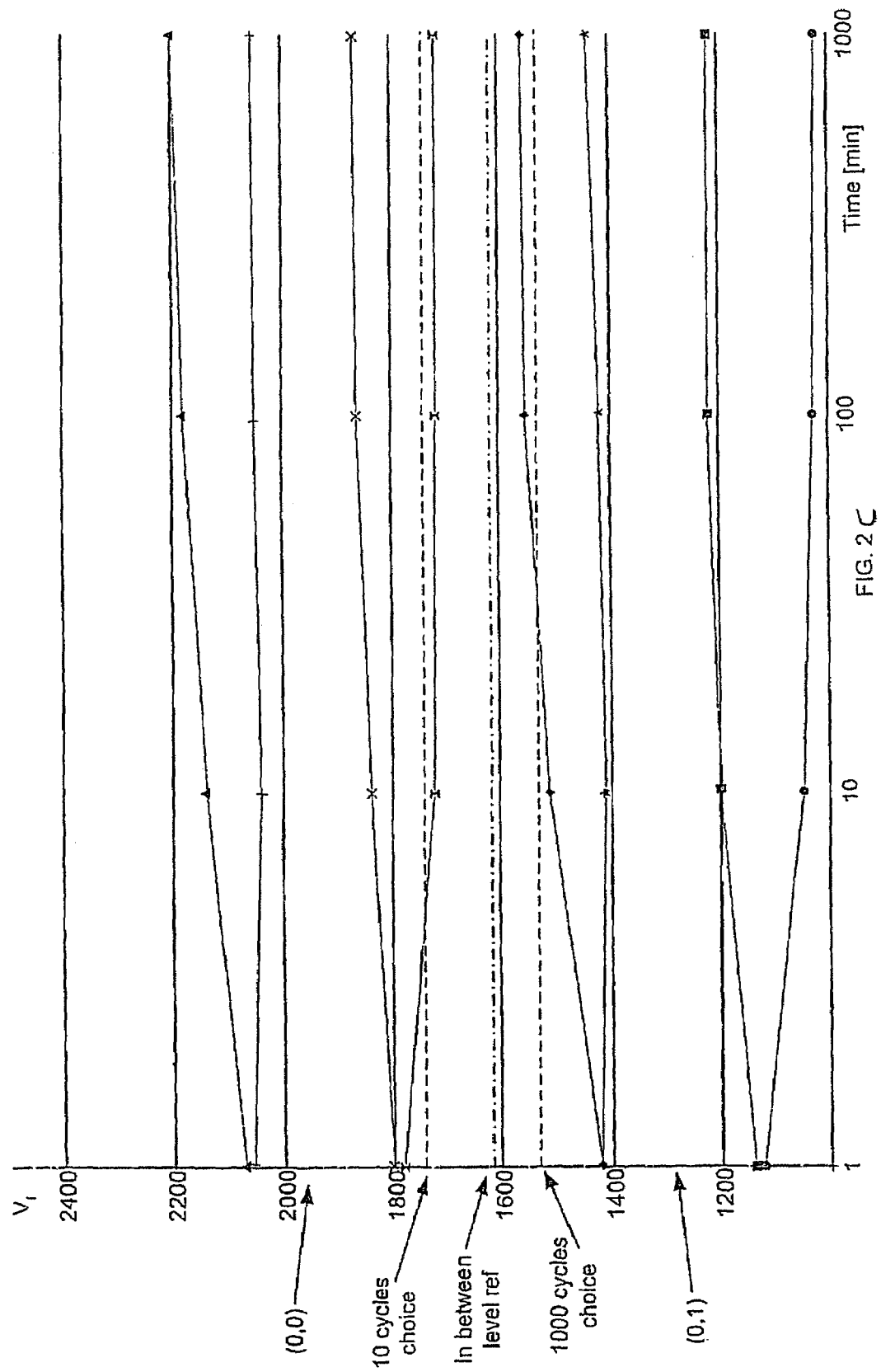
FIG. 2C is a graph illustrating measured changes in the threshold voltages ($V_t$) associated with each program state of an exemplary Multi Level Cell (MLC) due to $V_t$ drift, as a function of time, for 10 cycles and for 1000 cycles.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Unless specifically stated otherwise, as apparent from the following discussions, it is appreciated that throughout the specification discussions utilizing terms such as "processing", "deriving", "computing", "calculating", "determining", or the like, refer to the action and/or processes of a computer or computing system, or similar electronic computing device or logic circuitry (e.g. controller), that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

Applicants have realized that the window of operation may change over time as the cells go through multiple erase and programming cycles. The window of operation may shrink and/or may drift, both of which may affect the accuracy of the read operation.

The present invention is a method, circuit and system for determining a reference voltage. Some embodiments of the present invention relate to a system, method and circuit for establishing a set of operating reference cells to be used in operating (e.g. reading) cells in a NVM block or array. As part of the present invention, at least a subset of cells of the NVM block or array may be read using one or more reference voltage associated with two or more sets of test reference cells or structures, where each set of test reference cells or structures may generate or otherwise provide reference voltages at least slightly offset from each other set of test reference cells or structures. For each set of test reference cells/structures used to read the at least a subset of the NVM block, a read error rate may be calculated or otherwise determined. One or a set of test reference cells/structures associated with a relatively low read error rate may be selected as the set of operating reference cells to be used in operating (e.g. reading) other cells, outside the subset of cells, in the NVM block or array. In a further embodiment, the selected set of test reference cells may be used to select or establish an operating set of reference cells/structures having reference voltages substantially equal to those of the selected test set.

According to some embodiments of the present invention, prior or during the programming of a set of cells in the NVM array, the number of cells to be programmed to each of one or more logical or program states associated with the set of cells may be counted, and the logical state distribution may be stored, for example in a check sum table. As part of some embodiments of the present invention, the number of cells to be programmed to, up to and/or below each logical or program state may be counted and/or stored in a table with is either on the same array as the set of NVM cells or in memory on the same chip as the NVM array. According to some embodiments of the present invention, the logical state distribution of only the history cells associated with a block or sector of the array, or the entire array, may be counted and stored.

Upon the reading of the set of programmed cells, according to some embodiments of the present invention, the number of cells found to be at a given logical or program state may be compared against either corresponding values stored during programming (e.g. the number of cells programmed to a given state) or against a value derived from the values stored during programming (e.g. the number of cells programmed at or above the given state, minus the number of cells programmed to or above an adjacent higher logical state). If there is a discrepancy between the number of cells read at a given state and an expected number based on the values determined/counted/stored during programming, a Read Verify reference threshold value associated with the given program state may be adjusted upward or downward to compensate for the detected error. According to some embodiments of the present invention, the read verify level of an adjacent logical state may also be moved upward or downward in order to compensate for detected read errors at a given state.

For example, according to some embodiments of the present invention, if the number of cells found (e.g. read) in a given program state is below an expected value, either the Read Verify reference voltage associated with that given state may be reduced, or if there is found that the number of cells read above the given state exceeds an expected number, the Read Verify reference associated with a logical state higher and adjacent to the given state may be raised. Conversely, if the number of cells found (e.g. read) in a given program state is above expectations, either the Read Verify reference voltage associated with that given state may be increased, or if there is found that the number of cells read above the given state is below an expected number, the Read Verify reference associated with a logical state higher and adjacent to the given state may be lowered. Thus, Read Verify reference voltages for a set of cells may be selected such that the number of cells found/read in each of the states associated with the set may be substantially equal to the a number either read from or derived from the values counted during programming of the set of cells, which values may have been stored in a check sum table.

According to some embodiments of the present invention, the check sum table may reside on the same chip as the set of NVM cells, and according to a further embodiment of the present invention, a controller may be adapted to perform the above mentioned error detection and Read Verify reference value adjustments. The check sum table may either be stored in the same NVM array as the set of NVM cells, or on some other memory cells residing on the same chip as the NVM array, for example in a register or buffer used by the controller during programming and/or reading. According to other embodiments of the present invention, specialized error coding and detection circuits may be included with a controller on the same chip and the NVM array to be operated.

Read reference levels selected as part of the above mentioned steps may be performed in conjunction with other methods such as the use of one or more history cells. According to some embodiments of the present invention, an NVM device's control logic may compare sensed verses stored logical state distribution using an initial one or set of reference levels (i.e. test reference level/cells/structures) derived from one or more history cells, as described below.

Figure 3:
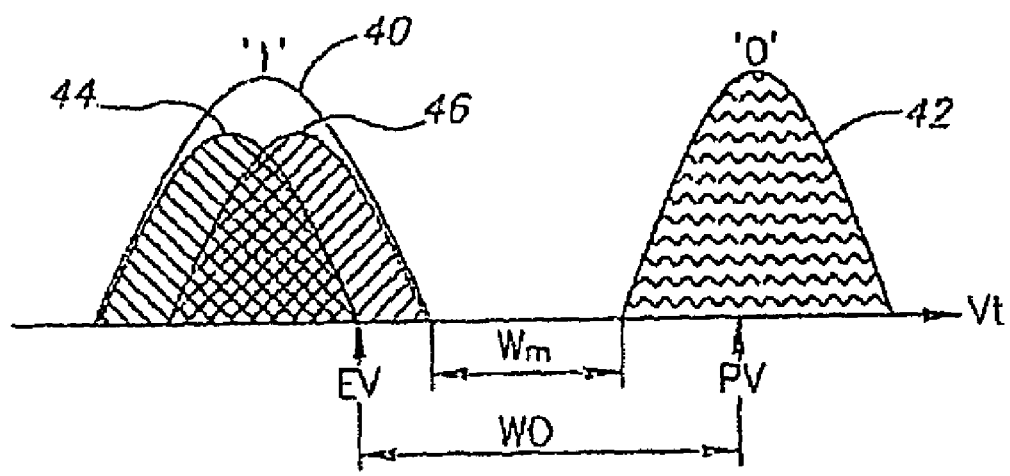
FIG. 3 is a schematic illustration of erase and programmed distributions at some point after the start of operation of an exemplary memory array.

Reference is now made to FIG. 3, which illustrates erase and programmed distributions 40 and 42, respectively, at some point after the start of operation of an exemplary memory array.

Although each bit may be erased to a threshold voltage below erase voltage EV, erase distribution 40 may appear to be shifted slightly above erase voltage EV. Applicants have realized that this may be due to the fact that the two bits of a cell have some effect on each other. If both bits are erased, then the threshold voltage of each bit may be below erase voltage EV (as indicated by the smaller distribution 44 within erase distribution 40). However, if one of the bits is programmed while the other bit is erased, the threshold voltage of the erased bit may appear higher, due to the programmed state of the other bit. This is indicated by the second small distribution 46 within erase distribution 40, some of whose bits may have threshold voltages that appear to be above erase voltage EV. This is typically referred as a "second bit effect". Additionally, erased bits may appear to be shifted slightly above erase voltage EV due to charge redistribution within the trapping layer and unintentional charge injection into the trapping layer.

Applicants have additionally realized that, after repeated program and erase cycles, programmed distribution 42 may shift below programming voltage PV. This may be due to the retention properties of the cells after erase/program cycles. This downward shift of the programmed distribution 42 is time and temperature dependent, and the shift rate also depends on the number of program/erase cycles that the cell has experienced in its past.

The result of these shifting distributions may be to shrink the window of operation to a different window Wm of operation. Applicants have realized that the different window Wm may or may not be aligned with the original window W0. FIG. 3 shows an exemplary window Wm with its center shifted from the center of the original window W0. Applicants have realized that one or both of these changes may have an effect on the quality of the read operation. This is illustrated in FIG. 4, to which reference is now made.

Figure 4:
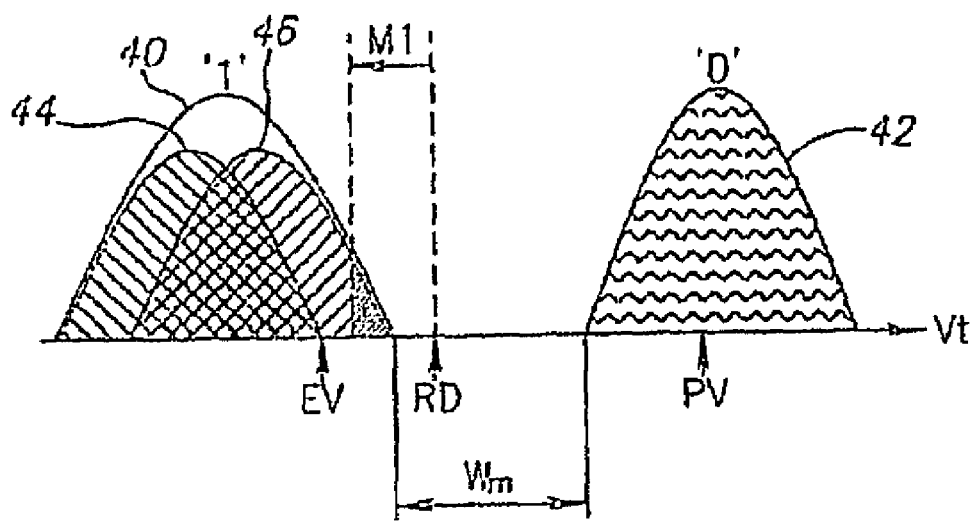
FIG. 4 is a schematic illustration of a reduction in the designed margin occurring as an outcome of the erase distribution shift illustrated in FIG. 3.

FIG. 4 is similar to FIG. 3 but with the addition of a read reference level RD and its associated design margin M1. Prior art requires that the read reference level RD be located according to the expected program and erase margin loss. Typically, program margin loss is larger, and thus, in FIG. 4, read reference level RD is allocated closer to the erase verify level EV to guarantee correct reading of the program state bit after retention loss occurs. The distance between read reference level RD and erase verify level EV is the total erase margin provided to assure correct reading of the erase state bits. Out of the total erase margin, margin M1 may be required to compensate for circuit deficiencies and to ensure a correct read of an erased bit. The original placement of the erased bits below the EV level (typically after an erase operation), provided a larger than M1 margin, and thus a reliable read of '1' bits. Unfortunately, as shown in FIG. 4, since erase distribution 40 may have drifted above erase threshold voltage EV, margin M1 may no longer be maintained. There may be some bits within erase distribution 46, indicated by solid markings, which may be wrongly read (i.e. read as programmed) since their threshold voltages are not below margin M1.

Figure 5A:
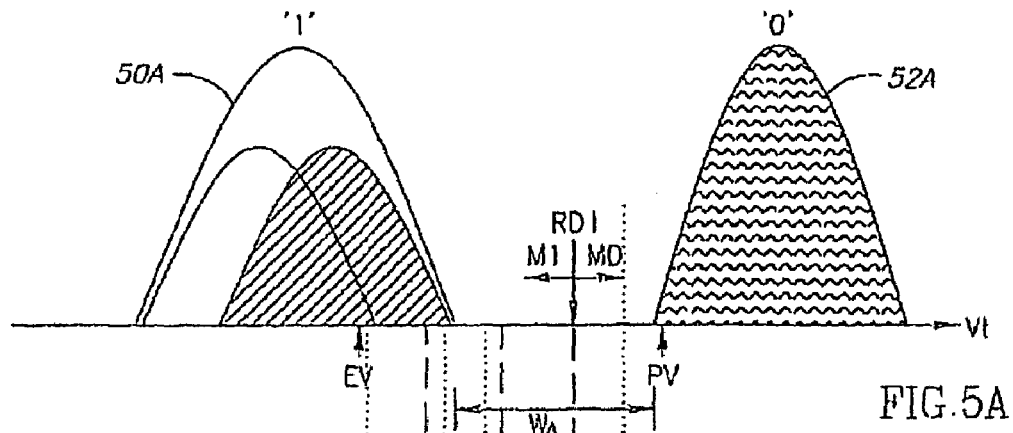
FIGS. 5A, 5B and 5C are schematic illustrations of a method of reading memory cells, constructed and operative in accordance with the present invention, using a moving read reference level which may move as a function of changes in the window of operation.
Figure 5B:
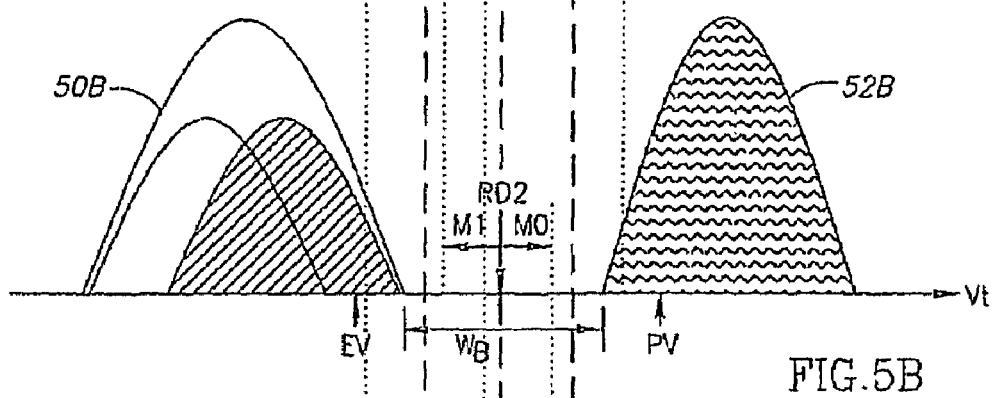
Figure 5C:
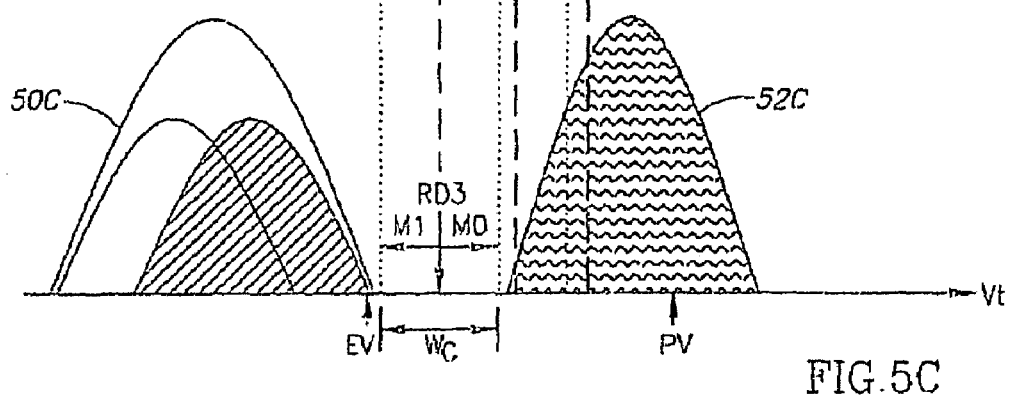

Reference is now made to FIGS. 5A, 5B and 5C, which together illustrate a method of reading memory cells, constructed and operative in accordance with the present invention, using a moving read reference level MRL, which may move as a function of changes in the window of operation.

In accordance with a preferred embodiment of the present invention, shortly after an erase and a program operation (FIG. 5A), moving read level MRL may be placed at a read level RD1 between an erase distribution 50A and a programmed distribution 52A, where erase distribution 50A is now slightly above erase threshold voltage EV (due to the second bit effect) and programmed distribution 52A is now entirely or almost entirely above programming threshold voltage PV. Suitable margins M1 and M0 may be defined from read level RD1 to overcome circuit and sensing scheme deficiencies and to ensure correct detection of the bit states. In FIG. 5A, the erase and program distributions are beyond margins M1 and M0, respectively. Therefore, at this point, read level RD1 may successfully and reliably read both 1's and 0's.

If the cells have already passed multiple programming and erase cycles, then, after a period of time, the distributions may shift. In FIG. 5B, the program distribution, now labeled 52B, has moved lower and thus, a significant part of it is below program threshold voltage PV. However, the erase distribution, here labeled 50B, has typically also moved lower. Even if the window of operation $W_B$ is close to or the same width as that in FIG. 5A (labeled $W_A$), its center has changed. As a result, read reference level RD1 with margin M0 may no longer correctly read all the bits in the program distribution 52B as '0'.

In accordance with a preferred embodiment of the present invention, for the situation of FIG. 5B, moving read level MRL may move to a second read level RD2. In this situation, when reading bits with reference to read level RD2, margins M0 and M1 are maintained, but relative to the shifted RD2 read level, and therefore all the bits in both distributions (50B and 52B) may be correctly read as erased ('1') or programmed ('0').

FIG. 5C shows a third case where the distributions may have shifted further, resulting in a window of operation $W_C$ that is further shrunk and/or shifted. In accordance with a preferred embodiment of the present invention, moving read level MRL may move to a third read level RD3 (along with margins M0 and M1) to accommodate the changed window of operation, and to ensure a reliable read of all the bits in the distributions 50C and 52C.

It will be appreciated that read levels RD1 and RD2 would not successfully read the distribution of FIG. 5C. Both read levels RD1 and RD2 would erroneously read at least some of the 0's (since the distance of the left side of the program distribution 52C to the read level is smaller than the required margin M0). Similarly, third read level RD3 would erroneously read some of the 1's had it been used for the distributions of FIGS. 5A and 5B since the right sides of distributions 50A and 50B do not maintain a required margin M1 from the read level RD3.

Figure 6A:
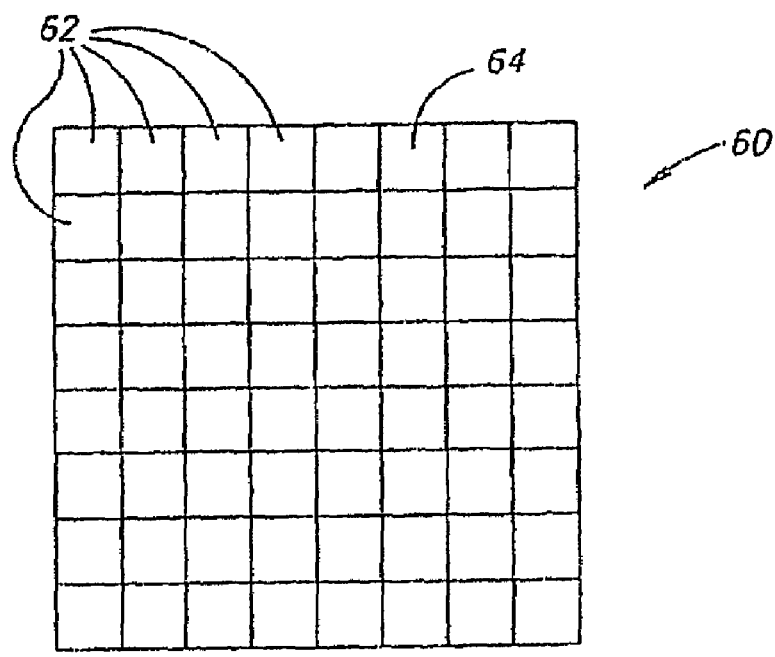
FIGS. 6A, 6B, 6C and 6D are schematic illustrations of alternative locations of history cells and memory cells, useful in implementing the method of FIGS. 5A, 5B and 5C.

Selecting which read level to utilize at any given time may be done in any suitable manner and all such methods are included in the present invention. An example is shown in FIG. 6A, to which reference is now made. In this example, the memory array, labeled 60, may comprise memory cells 62 to be read and history cells 64. At least one history cell 64 may be associated with a subset of memory cells 62 and may pass through substantially the same events and preferably substantially at the same time and with the same conditions as its corresponding subset of memory cells 62.

Figure 6B:
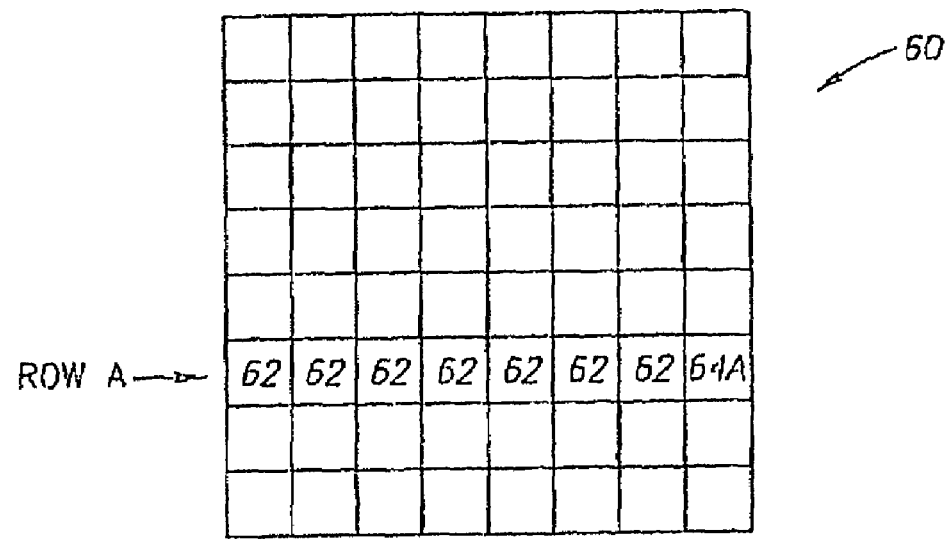

A specific example is shown in FIG. 6B, to which reference is now made. In this example, a history cell 64A may be associated with a row A of memory cells 62 and may be programmed and erased at the same time as cells 62, always being brought back to its known predetermined state. This predetermined state may be, for example, such that both bits (i.e. both storage areas) of the cell are in a programmed state, or, in a different case, only one of the bits is in a programmed state while the other bit remains erased.

Figure 6C:
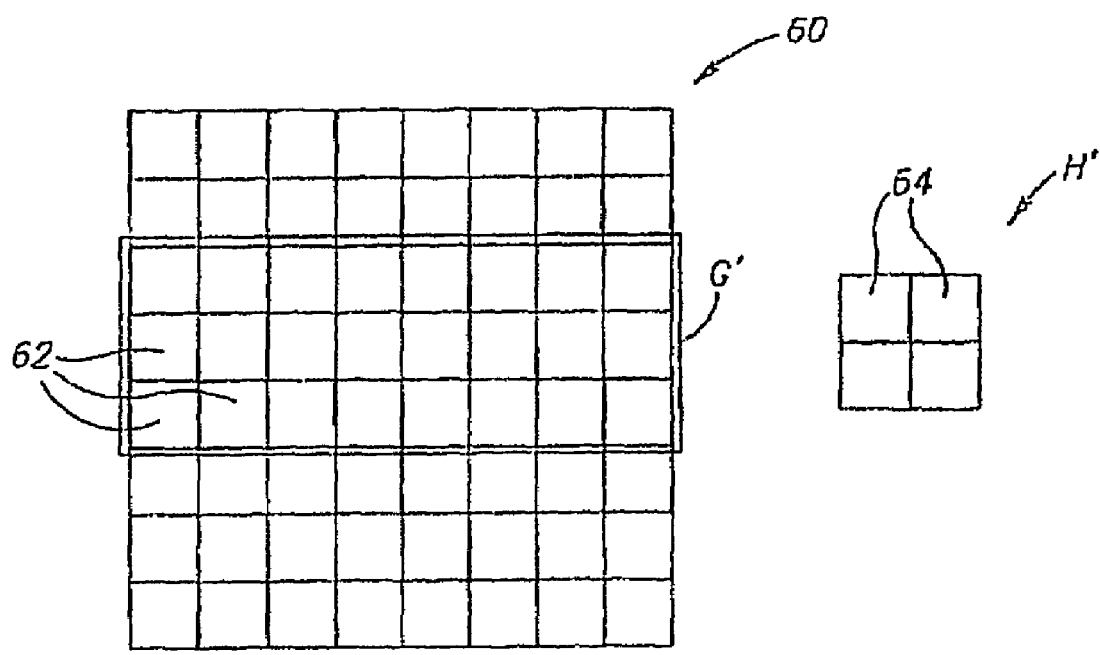

Another example is shown in FIG. 6C, to which reference is now made. In this example, a set H' of history cells 64 may be associated with a section G' of memory cells 62 in array 60. The set H' of history cells 64 may be anywhere in the memory array as long as the cells therein pass through substantially the same events at substantially the same conditions as memory cells 62 of section G' with whom they are associated. The history cells 64 are always brought back to a predetermined state. Some of the history cells 64 may have both bits (i.e. both storage areas) in a programmed state while other history cells may have only one of their bits in a programmed state.

Figure 6D:
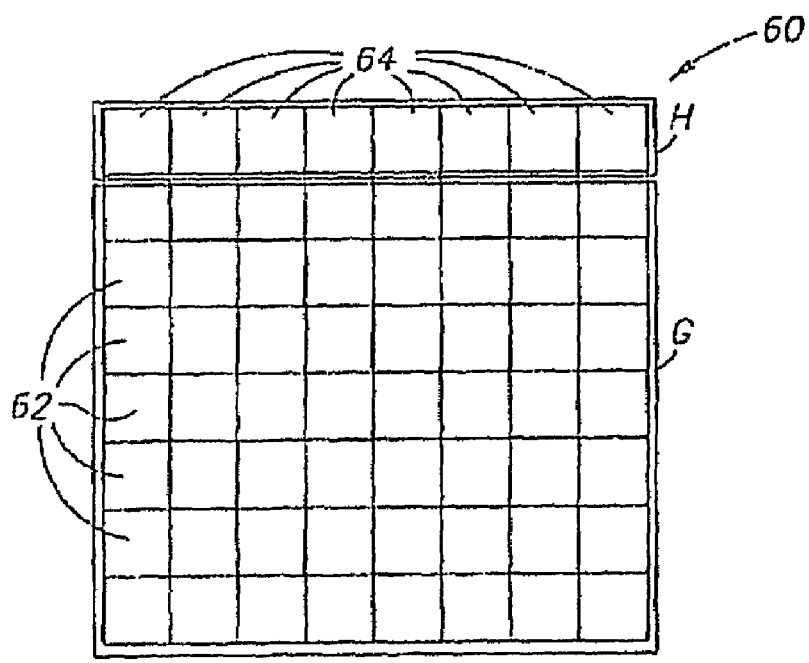

In FIG. 6D, a set H of history cells 64 may be a row of cells next to a section G of array 60. Typically, each such row may have 512-1K cells while there may be 256-512 rows in section G.

The history cells 64 may be utilized to determine the most appropriate reference read level to use for reading the subset of memory cells 62 to which they are associated. The reference read level, or more preferably, the highest reference read level, that may produce a correct readout of history cells 64 (a '0' readout, since the history cells 64 typically are in a programmed state) may be utilized with or without added margin to read its associated subset of memory cells 62.

The reference read level used to correctly read history cells 64 may be known as a "history read reference level". The associated subset of memory cells 62 may be read with a "memory read reference level" which may be the same as the history read reference level or it may have a margin added to it.

Figure 7:
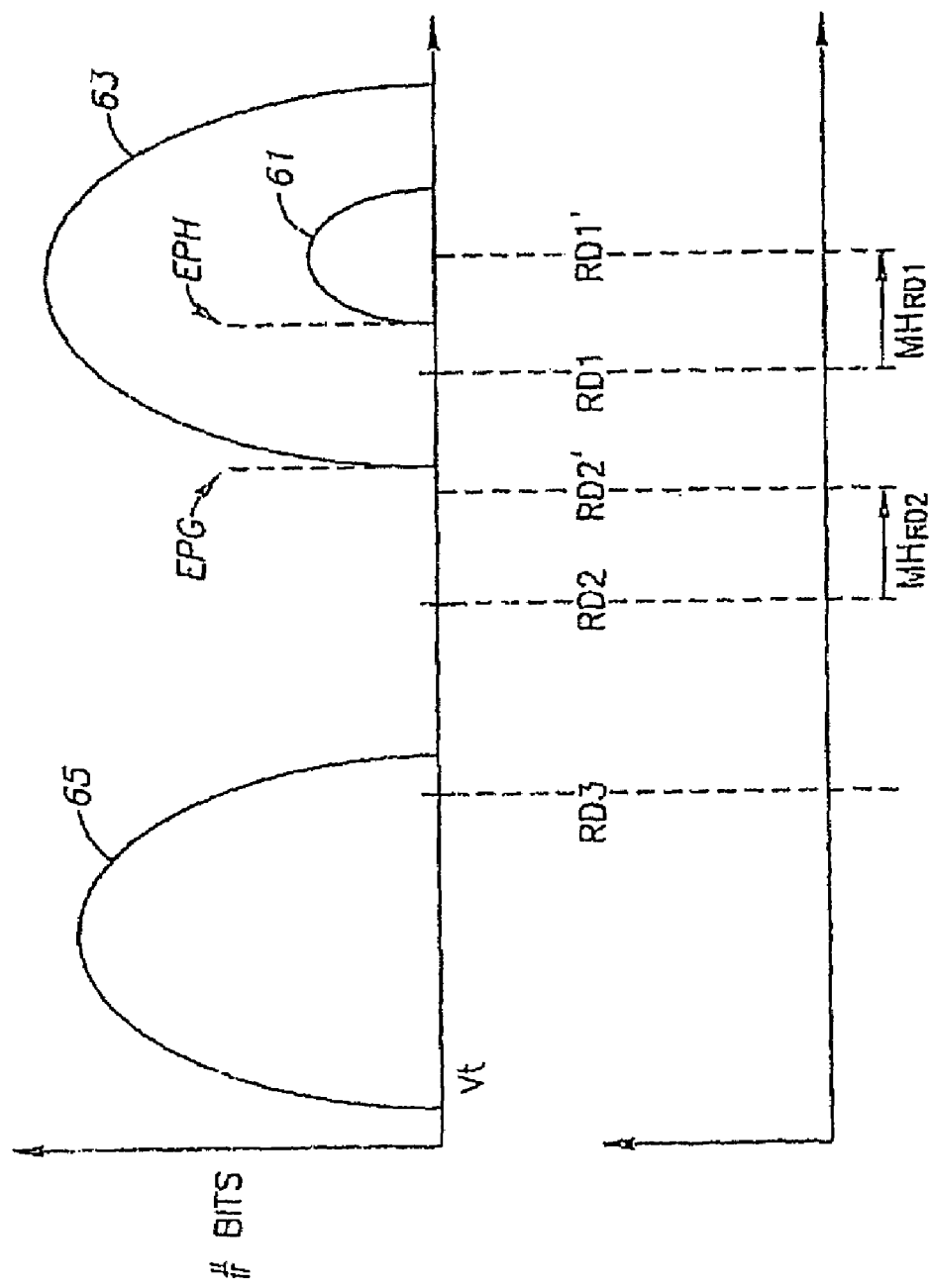
FIG. 7 is a schematic illustration of a method of determining a history read reference level and a memory read reference level for the history cells and memory cells of FIGS. 6A, 6B, 6C and 6D.

Reference is now made to FIG. 7, which shows two program distributions 61 and 63 and an erase distribution 65. Program distribution 61 may be the program distribution for history cells 64 shown in FIG. 6D, and program distribution 63 may be the program distribution for the group G of array cells 62 in array 60 with which history cells 64 may be associated. Because a lesser number of history cells 64 may represent a larger number of array cells 62, distribution 61 is shown in FIG. 7 to be smaller than distribution 63. Accordingly, an edge EPH of program distribution 61 may be located at a higher voltage than an edge EPG of program distribution 63.

FIG. 7 shows two history read levels RD1' and RD2' for defining the history read reference levels and three associated memory read levels RD1, RD2 and RD3, where RD1'>RD2' and RD1>RD2>RD3.

History program distribution 61 may first be checked with history read level RD1'. If, as shown in FIG. 7, part of history cells 64 are read as erased when read level RD1' is used, then history read level RD2' may be used to read history cells 64. In this example, history read level RD2' may be successful in reading history cells 64 and, accordingly, their associated subset G of memory cells 62 maybe read using its associated memory read reference level RD2. In the embodiment of FIG. 7, the lowest history read reference level, which, in this example is RD2', may be associated with either read level RD2 (when all of the history cells are read with history read level RD2' as programmed) or with read level RD3 (when part of the history cells are read with RD2' as erased).

FIG. 7 shows margins $MH_{RDi}$ between each history read level RDi' and its associated memory read level RDi. In the example of FIG. 7, the margins $MH_{RDi}$ may be defined as a projected difference EPH–EPG associated with the different number of bits in distributions 61 and 63. It will be appreciated that margin $MH_{RDi}$ may be defined in any other suitable manner.

Thus, to generalize, if part of set H of programmed history cells 64 are incorrectly read using history read level RD(j)' (i.e. they are read as erased), but correctly read using history read level RD(j+1)', then the associated subset G of memory cells 62 may preferably be read using the RD(j+1) memory read reference level. For this, there may be the same number of history read reference levels as memory read reference levels.

Alternatively and as discussed hereinabove with respect to FIG. 7, there may be one less history read reference level than memory read reference level. In this embodiment, the lowest level RD(j)' may provide two levels. correct reading of the lowest level RD(j)' may be associated with the RD(j) level while incorrect reading may be associated with the RD(j+1) level.

The most appropriate reference read level to be used for reading each of the subsets G of memory cells 62 may be determined in any one of a number of ways, of which four are described hereinbelow.

A) reading all or part of the history cells 64 vs. all or part of existing read reference cells having read reference levels RD(j).

B) reading all or part of the history cells 64 vs. specific reference cells placed at the read reference levels RD(j) plus some margin MH, where MH may be the projected difference EPH–EPG or any other suitable margin. Alternatively, there may be separate margins MH(j) for each read level RD(j).

C) reading all or part of the history cells 64 vs. all or part of the existing read reference cells having read reference levels RD(j) but activating the word lines of the history cells 64 at a different level than the word line of the read reference cells, in order to introduce some margin.

D) reading all or part of the history cells 64 vs. all or part of the existing read reference cells having read reference levels RD(j) but introducing some margin MH(j) at each of these read operations, for example by adding or subtracting a current or voltage signal to the signals of at least one of the history or the read reference cells.

These operations may be performed "on the fly" (before reading the associated subset G of memory cells 62) in applications that allow sufficient time to read the history cells 64 vs. the different history read reference levels and to determine the optimal memory read reference level for reading the associated subset G of memory cells 62. Alternatively, the history cells 64 may be read at predetermined times and, after analyzing the readouts and choosing the appropriate history read reference level, the results may be stored for later use when a read of memory cells 62 may be required. Such predetermined times may be at power-up of the device, prior to or after long operations (e.g. program or erase) or at idle times. The history cells 64 may be read serially, in parallel, and in a mixed serial/parallel form.

The history cells 64 may be of the same type of multi bit NROM cells as the array memory cells 62. They may be operated in a one bit per cell mode, in a dual bit per cell mode, or in a multilevel mode. The programmed state of history cells 64 may be achieved by programming only one or both bits in their cells. The history cells 64 may be erased close to, together with, or while erasing their associated memory cells 62. The programming of the history cells may be performed shortly after erasing them and their associated memory cells 62, or close to programming a subset of bits in their associated memory cells 62.

Applicants have realized that the efficacy of the moving read level method described in the present invention may be dependent upon the judicious placement of the memory read reference level so that incorrect reads of cells due to a diminished margin between the read level and the program and erase threshold voltages may not occur. As described hereinabove, the memory read reference level may be located on the basis of the history read reference level which is a function of history cells 64.

Figure 8:
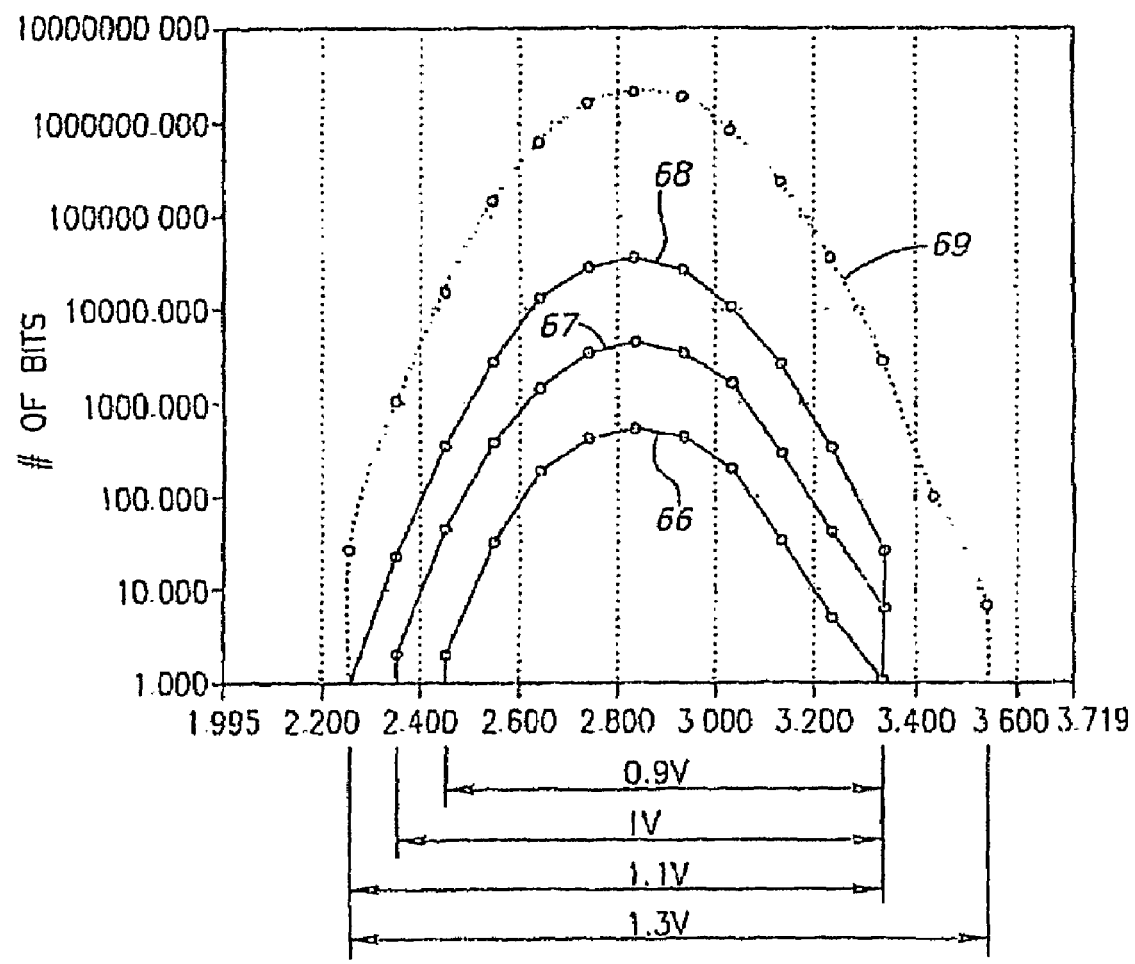
FIG. 8 is a schematic illustration of program threshold distributions of variously sized subgroups of memory cells in an NROM array.

Applicants have realized that a group of history cells 64 may be limited in its ability to faithfully represent its associated group of memory cells 62 due to a statistical phenomenon which is illustrated in FIG. 8. FIG. 8 illustrates that the ability of a subgroup, such as a group H of history cells 64, to faithfully represent the larger group of which it is a part, i.e. group G or G', is inherently imperfect. In FIG. 8, program threshold distributions 66, 67, 68 and 69 are shown for variously sized subgroups of memory cells in an NROM array. Curve 66 represents the program threshold distribution for a group of 800 memory cells, and the number of cells in the groups represented by curves 67, 68 and 69 are 7 thousand, 60 thousand and 3 million memory cells respectively. In accordance with statistical laws governing normal distributions such as program threshold distributions for a group G of memory cells 62 in an array 60, the larger the subgroup of memory cells, the wider its range of program threshold values. This is illustrated in FIG. 8 with the largest group of cells (curve 69) spanning a range of 1.3 V, and the smallest group of cells (curve 66) spanning a range of 0.9 V. The intermediate sized subgroups represented by curves 67 and 68 span ranges of 1V and 1.1 V respectively, as shown in FIG. 8.

Applicants have realized, therefore, that in a preferred embodiment of the present invention, the closer the number of history cells 64 in subset H approaches the number of cells in the array group G they are intended to represent, the more representative the sampling may be and the more effective the read level determined therefrom may be.

Figure 9:
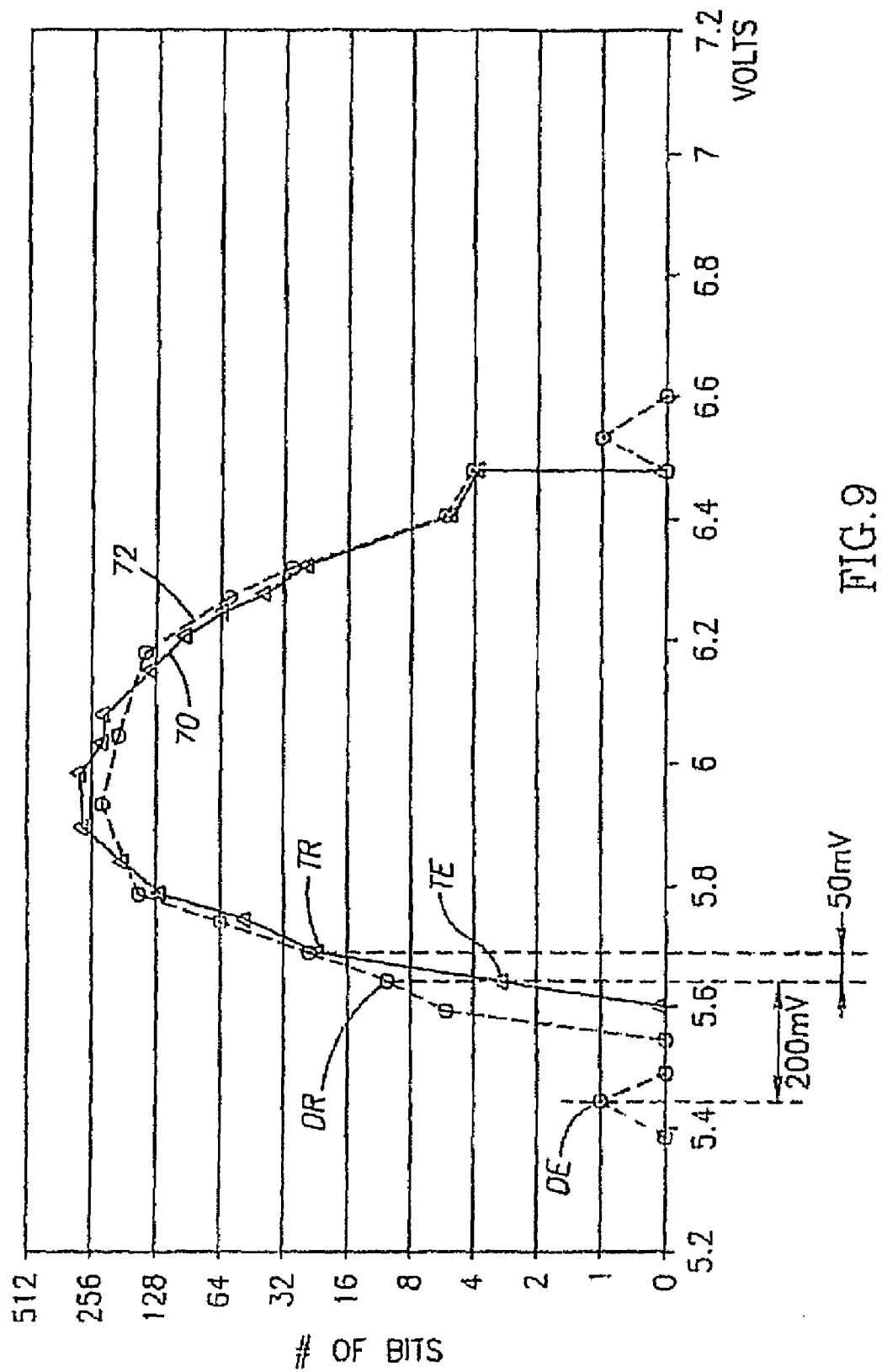
FIG. 9 is a schematic illustrative comparison between a smooth program threshold distribution and one with statistically jagged edges, useful in illustrating an alternative method of determining a read reference level in accordance with the present invention.

FIG. 9, reference to which is now made, shows an additional statistical characteristic of voltage distributions in cell subgroups of NROM arrays which may be addressed to improve the efficacy of a moving read level whose location is determined based on group H of history cells 64. FIG. 9 shows two threshold voltage distributions 70 and 72 for two subgroups of programmed NROM cells from the same array with an identical history. Distribution 70 is indicated with triangles and distribution 72 is indicated with dots. As may be seen in FIG. 9, the distributions show a very high degree of overlap, however, dot distribution 72 exhibits some "noise" at the edges, i.e., errant data points which fall outside the general pattern of the dot distribution. At the noisy left edge of dot distribution 72, with a threshold voltage of 5.45V, there is a point DE representing one bit. However, in triangle distribution 70, which exhibits no noise at the left edge, the smallest point on the left, labeled TE, is at 5.65V and represents 3 bits.

It is shown in FIG. 9 that, in the statistical event of an errant data point, using the lowest threshold voltage value Vtp of one group of history cells to establish the history read level may introduce significant uncertainty, as evidenced by the 200 mV discrepancy between analogous edge points on the program distributions of the two subgroups of the same array. Applicants have therefore realized that it may be preferable to determine the history read reference level at a point beyond the edges of the distributions where statistical noise may occur.

An exemplary point DR beyond the noisy edge of dot distribution 72 is indicated in FIG. 9. DR, located at 5.65V, represents 10 bits. It is the first point in dot distribution 72 where eight or more programmed cells would be sensed incorrectly as erased if the program threshold voltage was set at this point. The analogous point TR in triangle distribution 70 represents 24 bits and is located at 5.7V. It may be seen by a comparison of the 50 mV discrepancy between the threshold voltage values of non-edge points DR and TR and the 200 mV discrepancy between the threshold voltage values of edge points DE and TE that a non-edge point may provide a more meaningful reference point for a greater number of subgroups belonging to a single larger group, such as history group H associated with array group G.

Therefore, in accordance with a preferred embodiment of the present invention, a history read reference level and memory read reference level may be determined based on the threshold voltage distribution of history cells 64 as follows:

a) The history read reference level may be set to the program threshold voltage which is the Xth lowest threshold voltage in the distribution, where X may be between 1 and N, where N is the number of cells (for single bit cells) or bits (for multi-bit cells) in the distribution. The role of X is to reduce statistical uncertainty by avoiding the noisy edges of the distributions.

b) The memory read reference level, for sensing the associated group of cells in the array, may be set to a value based on the history read reference level with an additional margin added to it.

Applicants have further realized that the method by which history group H of history cells 64 and its associated array group G of memory cells 62 may be programmed, and the method by which such history cells 64 and array cells 62 may be erased may also be performed, in accordance with a preferred embodiment of the present invention, so as to maximize the match between history group H and array group G that they represent.

In accordance with an additional preferred embodiment of the present invention, history group H may be programmed after an intentional wait period introduced following their erasure, so that the time lapse between the erasure and programming of history group H may match the time lapse between the erasure and programming of their associated array group G, thus making history group H a better representative sample of array cells G.

In accordance with a further additional embodiment of the present invention, erase operations of array group G may be partitioned into subgroups, as is described in Applicants' co-pending application entitled "A Method of Erasing Non-Volatile Memory Cells" filed on the same day herewith and hereby included by reference. Applicants have realized that erasing memory cells in small groups may enhance the uniformity of these small groups of memory cells and their behavioral match with their associated history cells by preventing over-erasure of cells. Erasing cells in small groups may prevent over-erasure of cells by preventing the exposure of many memory cells, most of which may be successfully erased after a few erase operations, to repetitive erase operations necessary to erase only a few stubborn cells. Since a row of an array may typically be erased at very few erase pulses, this embodiment may be implemented by forming the small groups from rows of array 60.

Figure 10A:
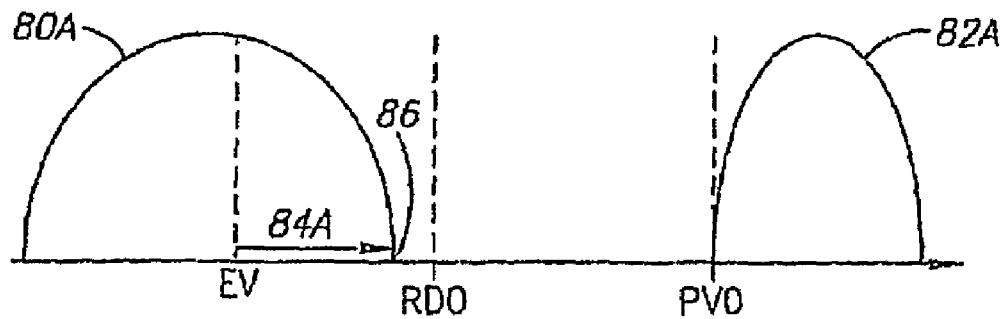
FIGS. 10A and 10B are schematic illustrations of program and erase threshold distributions illustrating the method of reducing a program verify level in accordance with the present invention.
Figure 10B:
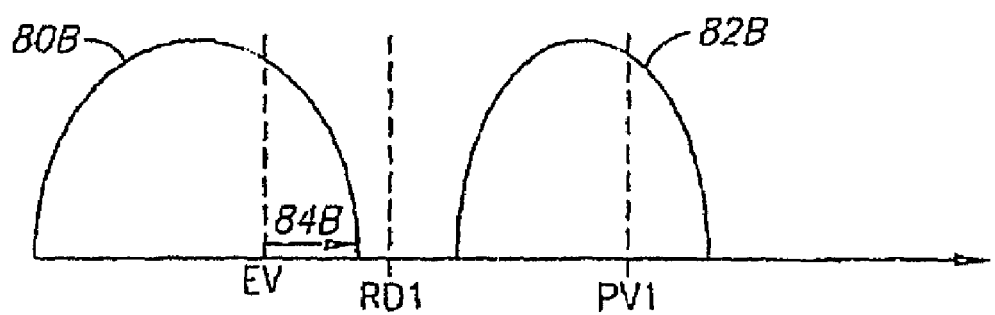

The efficacy of the moving read level method may also be enhanced by addressing the method by which array group G may be programmed. FIGS. 10A and 10B, reference to which is now made, illustrate how programming array group G in accordance with a preferred embodiment of the present invention may support the moving read level method of the present invention.

FIG. 10A shows an erase distribution 80A and a program distribution 82A after cycling while FIG. 10B shows an erase distribution 80B and a program distribution 82B after a retention bake after cycling.

It is shown in FIG. 10A that program distribution 82A is located completely above program verify level PV0, which is located at the leftmost edge of program distribution 82A. Erase distribution 80A on the other hand, extends past the erase verify level, EV. Applicants have realized that this overlap may be due to a "second bit effect" in which there is some electrical cross talk between the two bits in a dual bit cell when one bit is programmed and one bit is erased. Such a cross-talk results in an apparent increase in the threshold voltage of the erased bit due to the influence of its neighboring programmed bit. The accumulated threshold voltage increases in the erased bit neighbors of programmed bits cause the overlap of erased distribution 80A over erase verify level EV.

In FIG. 10A, in order to accommodate the second bit effect and provide accurate reads of all the erased bits, moving read level RD0 has moved to the right to establish a margin between an edge 86 of distribution 80A and read level RD0.

FIG. 10B illustrates the relative positions of program and erase distributions 82B and 80B respectively after a "retention after cycling" operation. A retention after cycling operation may be performed to emulate the capability of the chip to store the correct data for a long period of time after a large number of program and erase cycles has been performed. It involves cycling the bits between programming and erased states a large number of times (e.g. 100,000 cycles) and baking the chip for a pre-defined period of time. It is shown in FIG. 10B that both program distribution 82B and erase distribution 80B have shifted down, and the more extreme shift of program distribution 82B has caused a severe reduction of the sensing window between the rightmost edge of erase distribution 80B and the leftmost edge of program distribution 82B.

In accordance with a preferred embodiment of the present invention, in order to enhance the efficacy of a moving read level by providing a wider sensing window in which it may be located, a program verify level PV1 at which additional programming (without an erase operation performed) may be performed may be lowered in order to reduce the second bit effect and to keep the encroachment of the rightmost edge of erase distribution 80B on the sensing window at bay. This may imply that the overlap of the erase distribution with the EV level may decrease such that leftmost edge 84B may be less than leftmost edge 84A. Thus, moving read level RD1 may still be located between the distributions 80B and 82B and allow continued functionality of the cells.

In accordance with a preferred embodiment of the present invention, the program verify level may be returned to its initial level PV0 after an erase operation may be performed on the array or on a section of the array which utilizes lower program verify level PV1. This may be because, after erasure, the cells may be returned to a state closer to their natural state.

Moreover, the history read reference level and the memory read reference level may also be returned to their original levels after the erasure operation.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for selecting a read reference level associated with a given logical state for a set of non-volatile memory ("NVM") cells, said method comprising:
    deriving an initial read reference level from a history cell associated with the set of NVM cells; and
    comparing logical state distribution of the set of NVM cells sensed using the initial read reference level against a stored logical state distribution of the set of NVM cells.

2. The method according to claim 1, wherein deriving an initial read reference level comprises determining a reference level for the history cell.

3. The method according to claim 2, wherein the initial read reference level associated with a given logical state for a set of NVM cells is at a level not equal to the reference level of the history cell from which it is derived.

4. The method according to claim 3, wherein a difference between the initial read reference level associated with a given logical state for a set of NVM cells and the reference level for the history cell from which it is derived is based on a predetermined margin to be maintained.

5. The method according to claim 2, wherein the initial read reference level associated with a given logical state for a set of NVM cells is at a level substantially equal to the read reference level of the history cell from which it is derived.

6. The method according to claim 1 further comprising adjusting the initial read reference level based on results of the comparison of logical state distributions.

7. The method according to claim 2, wherein the initial read reference level is adjusted upward if the number of NVM cells sensed at a given logical state is higher than a stored value.

8. The method according to claim 2, wherein the initial read reference level is adjusted downward if the number of cells sensed at a given logical state is lower than a stored value.

9. An non-volatile memory ("NVM") device comprising:
   an NVM array including a set of non-volatile memory ("NVM") cells; and
   control logic adapted derive an initial read reference level from a history cell associated with the set of NVM cells; and
   to compare logical state distribution of the set of NVM cells sensed using the initial read reference level against a stored logical state distribution of the set of NVM cells.

10. The device according to claim 9, wherein the control logic is adapted to derive an initial read reference level by determining a reference level for the history cell.

11. The device according to claim 10, wherein the initial read reference level associated with a given logical state for a set of NVM cells is at a level not equal to the reference level of the history cell from which it is derived.

12. The device according to claim 11, wherein a difference between the initial read reference level associated with a given logical state for a set of NVM cells and the reference level for the history cell from which it is derived is based on a predetermined margin to be maintained.

13. The device according to claim 10, wherein the initial read reference level associated with a given logical state for a set of NVM cells is at a level substantially equal to the reference level of the history cell from which it is derived.

14. The device according to claim 9, wherein said control logic is further adapted to adjust the initial read reference level based on results of the comparison of logical state distributions.

15. The device according to claim 10, wherein the initial read reference level is adjusted upward if the number of NVM cells sensed at a given logical state is higher than a stored value.

16. The device according to claim 10, wherein the initial read reference level is adjusted downward if the number of cells sensed at a given logical state is lower than a stored value.

* * * * *